(12) United States Patent
Kawaguchi et al.

(10) Patent No.: US 8,571,083 B2
(45) Date of Patent: Oct. 29, 2013

(54) NITRIDE SEMICONDUCTOR LASER CHIP

(75) Inventors: Yoshinobu Kawaguchi, Osaka (JP);
Takeshi Kamikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 207 days.

(21) Appl. No.: 12/785,523

(22) Filed: May 24, 2010

(65) Prior Publication Data
US 2010/0316082 A1   Dec. 16, 2010

(30) Foreign Application Priority Data
Jun. 11, 2009   (JP) ................. 2009-140083

(51) Int. Cl.
*H01S 5/00*   (2006.01)

(52) U.S. Cl.
USPC ........................................ 372/49.01

(58) Field of Classification Search
USPC ............... 257/103; 372/44.01; 438/39
See application file for complete search history.

(56) References Cited

U.S. PATENT DOCUMENTS

| | | | |
|---|---|---|---|
| 6,990,133 B2 | 1/2006 | Kikawa | |
| 7,646,798 B2* | 1/2010 | Michiue et al. | 372/49.01 |
| 2006/0133442 A1* | 6/2006 | Kondou et al. | 372/49.01 |
| 2007/0080368 A1* | 4/2007 | Kamikawa et al. | 257/103 |
| 2007/0138491 A1 | 6/2007 | Kawaguchi | |
| 2007/0138492 A1 | 6/2007 | Kamikawa | |
| 2007/0205424 A1 | 9/2007 | Kamikawa | |
| 2007/0210324 A1* | 9/2007 | Kawaguchi et al. | 257/96 |

FOREIGN PATENT DOCUMENTS

| | | |
|---|---|---|
| JP | 09-283843 | 10/1997 |
| JP | 2005-175111 | 6/2005 |
| JP | 2006-203162 | 8/2006 |
| JP | 2007-103814 | 4/2007 |
| JP | 2007-165711 | 6/2007 |
| JP | 2007-189201 | 7/2007 |
| JP | 2007-189207 | 7/2007 |
| JP | 2007-273951 | 10/2007 |
| JP | 2008-147363 | 6/2008 |
| JP | 2008-182208 | 8/2008 |

* cited by examiner

*Primary Examiner* — Jessica Stultz
*Assistant Examiner* — Tuan Nguyen
(74) *Attorney, Agent, or Firm* — Harness, Dickey & Pierce, P.L.C.

(57) ABSTRACT

A nitride semiconductor laser chip is provided that offers sufficient reliability even at high output. The nitride semiconductor laser chip has a nitride semiconductor layer formed on a substrate, a resonator facet formed on the nitride semiconductor layer, and a coating film formed on the resonator facet and containing Ar. The coating film has, in a region contiguous with the resonator facet and in the vicinity thereof, a low-Ar region with a low Ar content and, on the side of this low-Ar region opposite from the resonator facet, a high-Ar region with a higher Ar content than the low-Ar region.

14 Claims, 18 Drawing Sheets

NITRIDE SEMICONDUCTOR LASER CHIP

This nonprovisional application claims priority under 35 U.S.C. §119(a) on Patent Application No. 2009-140083 filed in Japan on Jun. 11, 2009, the entire contents of which are hereby incorporated by reference.

BACKGROUND OF THE INVENTION

1. Field of the Invention

The present invention relates to a nitride semiconductor laser chip, and more particularly to a nitride semiconductor laser chip having a coating film formed on a resonator facet.

2. Description of Related Art

Nitride semiconductor laser chips employing a nitride semiconductor are used in high-density optical disc systems with high storage capacities, specifically as a light source for reading information from and writing information to BDs (Blu-ray Discs (a registered trademark)). In such high-density optical disc systems, for increasingly fast writing to discs with increasingly large numbers of layers, nitride semiconductor laser chips with high optical output have been sought eagerly.

On the other hand, recent years have seen many attempts to use nitride semiconductor laser chips not only as a light source in optical disc systems but also for lighting and in displays. Also in cases where nitride semiconductor laser chips are used for such purposes, demand is strong for nitride semiconductor laser chips with higher output.

Disadvantageously, however, it is known that when a nitride semiconductor laser chip is operated at high optical output, the resonator (cavity) facets deteriorate easily, their deterioration leading to low reliability. In increasing the output of a nitride semiconductor laser chip, therefore, it is essential to suppress deterioration of the resonator facets.

Accordingly, there have conventionally been proposed nitride semiconductor laser chips in which, to suppress deterioration of the resonator facets, a protective film (coating film) in a crystalline state is formed on the resonator facets. One example of such a nitride semiconductor laser chip is proposed in JP-A-2008-182208.

Inconveniently, however, even with the conventional technology proposed in JP-A-2008-182208, sufficient reliability is not obtained in cases where nitride semiconductor laser chips are operated at such high optical output as sought in these days.

SUMMARY OF THE INVENTION

The present invention has been devised to solve the problems mentioned above, and it is an object of the invention to provide a nitride semiconductor laser chip that offers sufficient reliability even at high output.

To achieve the above object, through intensive studies, the inventors of the present invention have found out the following: when a coating film is formed by a sputtering process using a rare gas element, by controlling the amount of the rare gas element absorbed into the coating film such that different amounts are absorbed between regions contiguous with and away from the resonator facets, it is possible to enhance reliability at high output.

Specifically, a nitride semiconductor laser chip according to one aspect of the invention is provided with: a nitride semiconductor layer formed on a substrate; a resonator facet formed on the nitride semiconductor layer; and a coating film foamed on the resonator facet and containing a rare gas element. Here, the coating film has a first region contiguous with the resonator facet and a second region disposed on the side of the first region opposite from the resonator facet. Moreover, the content of the rare gas element in the first region is lower than the content of the rare gas element in the second region.

In this nitride semiconductor laser chip of one aspect of the invention, as described above, the first region contiguous with the resonator facet is formed so as to have a lower rare gas element content than the second region; this makes it possible to suppress light absorption in the first region, and thus to suppress heating in the first region resulting from light absorption. It is thus possible to suppress a rise in temperature at the resonator facet, and thus to suppress the inconvenience of proliferation of non-radiative recombination centers resulting from a rise in facet temperature. In this way, it is possible to suppress excessive heating of the resonator facet resulting from proliferation of non-radiative recombination centers, and thus to suppress deterioration of the resonator facet. Consequently, it is possible to suppress a lowering in reliability.

Moreover, according to one aspect, the rare gas element content in the second region disposed on the side of the first region opposite from the resonator facet is made higher than in the first region; this makes it possible to form the coating film closely-packed in the second region. It is thus possible to suppress diffusion of moisture and oxygen from the atmosphere, and thus to suppress moisture and oxygen from outside permeating through the coating film and penetrating to the resonator facet. In this way, it is possible to suppress oxidation of the resonator facet, and thus to suppress proliferation of non-radiative recombination centers resulting from oxidation of the resonator facet. This too makes it possible to suppress excessive heating of the resonator facet, and thus to suppress deterioration of the resonator facet.

As described above, according to one aspect, the first region contiguous with the resonator facet is assigned the function of suppressing absorption of laser light, and the second region disposed on the coating film's surface side is assigned the function of suppressing diffusion of moisture and oxygen from the atmosphere to the resonator facet; this makes it possible to effectively enhance the COD (catastrophic optical damage). Here, the COD level denotes the critical output at which COD (catastrophic optical damage) occurs. In that way, it is possible to easily suppress deterioration of the resonator facet ascribable to optical damage even in operation at higher optical output. Consequently, it is possible to obtain sufficient reliability even at high output.

If moisture diffuses into the coating film, the moisture inside the coating film not only itself absorbs laser light but also, by a not well understood mechanism, forms absorption centers inside the coating film to absorb laser light. According to one aspect, however, owing to the nitride semiconductor laser chip being so structured as to suppress diffusion of moisture into the coating film as described above, it is possible to easily suppress light absorption in the coating film resulting from diffusion of moisture.

In the above-described nitride semiconductor laser chip according to one aspect, it is preferable that the first and second regions be fanned of mutually different materials. With this structure, it is possible to increase flexibility in the design of the coating film, and thus to suppress deterioration of the resonator facet more easily. In this way, it is possible to easily obtain sufficient reliability even at high output. For example, the first region of the coating film is formed of a material that can reduce the rate of non-radiative recombination at the interface between the nitride semiconductor layer and the coating film, and the second region of the coating film is formed of a material difficult for moisture and oxygen to diffuse into; this makes it possible to obtain a nitride semiconductor laser chip with a high COD level. Incidentally, forming the first and second regions out of mutually different materials also offers an effect of making it easy to design the reflectance of the coating film.

In the above-described nitride semiconductor laser chip according to one aspect, the first and second regions may be formed of the same material. With this structure, for example, by forming the coating film as a single film, it is possible to easily form the coating film including the first and second regions. In this way, it is possible to obtain, with satisfactory productivity, a nitride semiconductor laser chip that offers sufficient reliability even at high output.

In the above-described nitride semiconductor laser chip according to one aspect, it is preferable that the first region of the coating film include an aluminum nitride film or an aluminum oxynitride film. With this structure, it is possible to easily reduce the rate of non-radiative recombination at the interface between the nitride semiconductor layer and the coating film, and thus to easily enhance the COD level.

In the above-described nitride semiconductor laser chip according to one aspect, the first region of the coating film may include an aluminum oxide film.

In the above-described nitride semiconductor laser chip according to one aspect, it is preferable that the second region of the coating film include an aluminum oxide film, a silicon oxide film, or a silicon nitride film. With this structure, it is possible to effectively suppress diffusion of moisture and oxygen, and thus to effectively suppress proliferation of non-radiative recombination centers resulting from oxidation of the resonator facet.

In the above-described nitride semiconductor laser chip according to one aspect, it is preferable that the first region have a thickness of 5 nm or more but 100 nm or less in the thickness direction of the coating film. With this structure, it is possible to suppress the inconvenience of easy deterioration of the resonator facet ascribable to light absorption in the second region with a high rare gas element content resulting from the thickness of the first region being too small. It is also possible to suppress the inconvenience of too large a non-closely-packed region in the coating film resulting from the thickness of the first region being too great, and thus to suppress the inconvenience of easy diffusion of moisture and oxygen from outside.

In the above-described nitride semiconductor laser chip according to one aspect, preferably, the second region has a greater thickness than the first region in the thickness direction of the coating film. With this structure, it is possible to effectively suppress moisture and oxygen from outside permeating through the coating film and penetrating to the resonator facet, and thus to effectively suppress oxidation of the resonator facet. In this way, it is possible to easily suppress proliferation of non-radiative recombination centers resulting from oxidation of the resonator facet, and thus to easily suppress excessive heating of the resonator facet. Consequently, it is possible to more easily suppress deterioration of the resonator facet.

In the above-described nitride semiconductor laser chip according to one aspect, it is preferable that the rare gas element be argon, and that the content of Ar in the first region be 3% or less by number of atoms.

In that case, it is more preferable that the content of Ar in the first region be 1% or less by number of atoms.

In the above-described nitride semiconductor laser chip according to one aspect, the resonator facet may comprise a light-emission-side resonator facet and a light-reflection-side resonator facet, and the coating film may comprise a coating film formed on the light-emission-side resonator facet and a coating film formed on the light-reflection-side resonator facet. In a case where the nitride semiconductor laser chip is operated at higher output, not only the light-emission-side resonator facet but also the light-reflection-side resonator facet may affect reliability. Thus, with that structure, it is possible to further enhance reliability.

In the above-described nitride semiconductor laser chip according to one aspect, preferably, the first region in the coating film is crystallized. With this structure, it is possible to enhance adhesion between the resonator facet and the coating film. The enhanced adhesion helps improve the reliability of the nitride semiconductor laser chip. In this way, it is possible to easily obtain a nitride semiconductor laser chip with superb high-output characteristics. Incidentally, by making the crystal system of the crystallized first region uniform, it is possible to further enhance adhesion. Moreover, by crystallizing the first region in the coating film, since a crystalline film is less permeable to moisture and oxygen from the atmosphere than an amorphous film, it is possible to effectively suppress moisture and oxygen penetrating to the resonator facet. The reason is considered to be that a crystalline film has a higher film density than an amorphous film. Growing the first region epitaxially with respect to the base semiconductor (resonator facet) gives better crystallinity, and thus helps further enhance the permeation suppressing effect.

In the above-described nitride semiconductor laser chip according to one aspect, the second region in the coating film may include at least a region in an amorphous state.

As described above, according to the present invention, it is possible to easily obtain a nitride semiconductor laser chip that offers sufficient reliability even at high output.

DETAILED DESCRIPTION OF PREFERRED EMBODIMENTS

Hereinafter, specific embodiments of the present invention will be described in detail with reference to the accompanying drawings.

Embodiment 1

Figure 1:
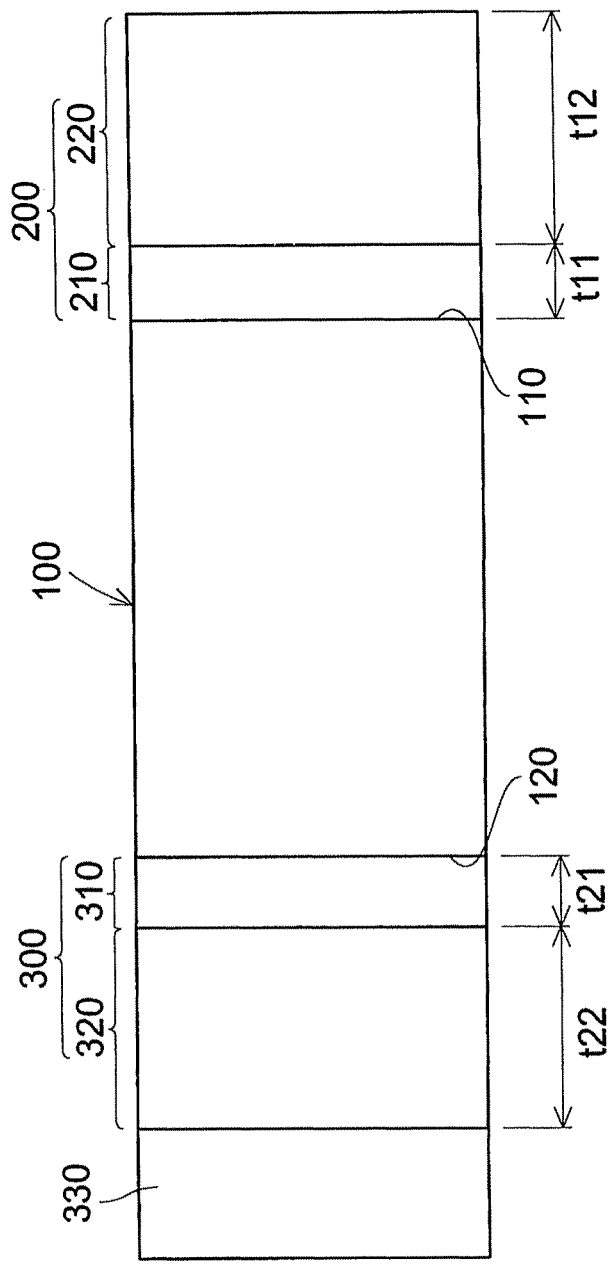
FIG. 1 is a side view schematically showing a nitride semiconductor laser chip according to Embodiment 1 of the invention.
Figure 2:
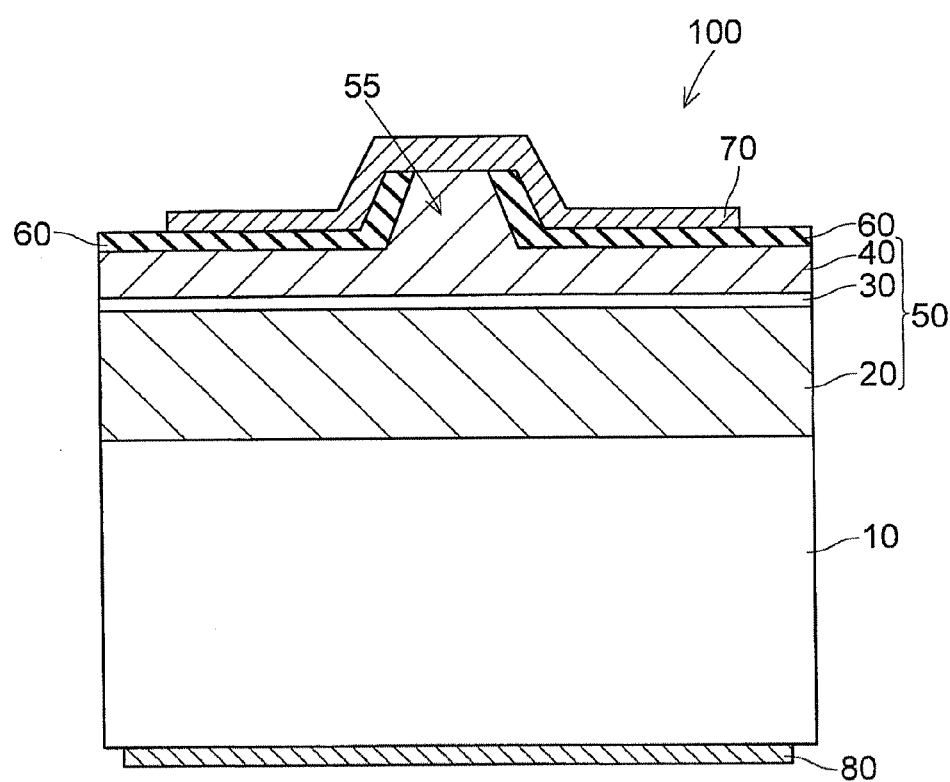
FIG. 2 is a sectional view schematically showing a nitride semiconductor laser chip according to Embodiment 1 of the invention.

FIG. 1 is a side view schematically showing a nitride semiconductor laser chip according to a first embodiment (Embodiment 1) of the invention. FIG. 2 is a sectional view schematically showing a nitride semiconductor laser chip according to Embodiment 1 of the invention. First, with reference to FIGS. 1 and 2, the structure of a nitride semiconductor laser chip according to Embodiment 1 will be described.

As shown in FIG. 1, the nitride semiconductor laser chip according to Embodiment 1 is provided with a light-emitting structure member 100 having a pair of resonator (cavity) facets 110 and 120 opposite each other. One resonator facet 110 of the light-emitting structure member 100 is located on the light emission side, and the other resonator facet 120 is located on the light reflection side. The resonator facet 110 on the light emission side is the one provided on that side at which the reflectance at the wavelength of the laser light is lower. The light that comes out through this light-emission-side resonator facet 110 is used as the emitted light. On the other hand, the resonator facet 120 on the light reflection side is the one provided on that side at which the reflectance at the wavelength of the laser light is higher.

Coating films 200 and 300 are formed on the light-emission-side and light-reflection-side resonator facets 110 and 120 respectively. These coating films 200 and 300 are each formed by a sputtering process using Ar (argon), which is a rare gas element, and thus they contain Ar atoms. In Embodiment 1, the coating films 200 and 300 are amorphous.

A sputtering process produces closely-packed coating films at low temperatures from room temperature to about 300° C., and is suitably used for the formation of the coating films. On the other hand, Ar is relatively inexpensive among chemically stable rare gas elements, and is commonly used as a gas source of incident ions in a sputtering process. Disadvantageously, however, when the coating films are formed by a sputtering process using Ar, the films inevitably absorb Ar.

A coating film containing Ar suffers from light absorption, and thus, with consideration given to light absorption, the less Ar is absorbed, the better.

On the other hand, through various studies, the inventors of the present invention have found out that, to form closely-packed films, when the coatings film are formed by a sputtering process, it is preferable to hold the Ar partial pressure low to lengthen the mean free path length of Ar atoms, thereby to raise the energy of Ar atoms as sputtering particles ejected from the target. At this time, lowering the Ar partial pressure increases the amount of Ar absorbed into the coating films. Thus, there is a tradeoff between lowering the amount of Ar absorbed and forming closely-packed films, and it is impossible to achieve both aims simultaneously. That is, there is no way to reduce the amount of Ar absorbed and simultaneously form closely-packed films.

To overcome the tradeoff, in the nitride semiconductor laser chip according to Embodiment 1, in a region of a coating film contiguous with a resonator facet and in the vicinity thereof, the Ar content (the amount of Ar absorbed) is made low (small) and, in a region on the coating film's surface side of that region (on the side opposite from the resonator facet), the Ar content (the amount of Ar absorbed) is made higher (greater). That is, the Ar content in a coating film is not constant in its thickness direction, but is lower in a region contiguous with a resonator facet and in the vicinity thereof than on the coating film's surface side.

Accordingly, in Embodiment 1, the coating film 200 includes a low-Ar region 210 that makes direct contact with the light-emission-side resonator facet 110 and a high-Ar region 220 disposed on top of the low-Ar region 210 (on the side opposite from the resonator facet 110). Likewise, the coating film 300 includes a low-Ar region 310 that makes direct contact with the light-reflection-side resonator facet 120 and a high-Ar region 320 disposed on top of the low-Ar region 310 (on the side opposite from the resonator facet 120). The low-Ar regions 210 and 310 are each an example of a "first region" according to the invention, and the high-Ar regions 220 and 320 are each an example of a "second region" according to the invention.

Moreover, in Embodiment 1, as described above, the low-Ar regions 210 and 310 are so formed that the Ar content there is smaller (lower) than in the high-Ar regions 220 and 320. Here, it is preferable that the Ar content in the low-Ar regions 210 and 310 be lower than 3% by number of atoms, and more preferably 1% or less by number of atoms. On the other hand, the Ar content in the high-Ar regions 220 and 320 has only to be higher than the Ar content in the low-Ar regions 210 and 310. It is preferable that the Ar content in the high-Ar regions 220 and 320 be about 1% to 3% by number of atoms higher than the Ar content in the low-Ar regions 210 and 310. In a case where the high-Ar region 220 is formed of a multi-layer film, the Ar content in the high-Ar region 220 does not need to be constant in the thickness direction of the coating film 200; the high-Ar region 220 has only to include, as part of it, a region where the Ar content is greater than in the low-Ar region 210. Similar considerations apply in a case where the high-Ar region 320 of the coating film 300 formed on the light-reflection-side resonator facet 120 is formed of a multi-layer film.

As described above, in the nitride semiconductor laser chip according to Embodiment 1, in the vicinity of the resonator facets, the low-Ar regions 210 and 310 for suppressing light absorption are provided and, on the coating films' surface side (the side opposite from the resonator facets) of the low-Ar regions 210 and 310, the high-Ar regions 220 and 320 are provided which are more closely-packed films (closely-packed regions) than the low-Ar regions 210 and 310.

The light-emission-side coating film 200 is so formed that the thickness t12 of the high-Ar region 220 (its thickness in the thickness direction of the coating film 200) is greater than the thickness t11 of the low-Ar region 210 (its thickness in the thickness direction of the coating film 200). In this case, it is preferable that the thickness t11 of the low-Ar region 210 be 5 nm or more but 100 nm or less. With the thickness t11 of the low-Ar region 210 smaller than 5 nm, the high-Ar region 220 is so close to the resonator facet 110 that the effect of light absorption in the high-Ar region 220 is not negligible, resulting in the inconvenience of easy deterioration of the resonator facet 110. On the other hand, with the thickness t11 of the low-Ar region 210 greater than 100 nm, the coating film 200 includes too large a non-closely-packed region, resulting in the inconvenience of easy diffusion of moisture and oxygen from outside.

As with the light-emission-side coating film 200, it is preferable that the light-reflection-side coating film 300 be so formed that the thickness t22 of the high-Ar region 320 (its thickness in the thickness direction of the coating film 300) is greater than the thickness t21 of the low-Ar region 310 (its thickness in the thickness direction of the coating film 300). In this case, as with the light-emission-side coating film 200, it is preferable that the thickness t21 of the low-Ar region 310 be 5 nm or more but 100 nm or less.

The coating films 200 and 300 are formed of an oxide of Al, Si, Zr, Ta, Ga, Y, Nb, Hf, Zn, or Ti, a nitride or oxynitride (oxide-nitride) of Al, Si, Ga, or B, or the like.

For reduced threshold current and hence increased differentiation efficiency, it is preferable that the reflectance of the resonator facet 120 be 60% to 99%. To achieve this, at the light-reflection-side resonator facet 120, a high-reflectance multi-layer film 330 for adjustment of reflectance is formed on the coating film 300.

In a specific structure of the light-emitting structure member 100, as shown in FIG. 2, a semiconductor laser chip portion 50 including a plurality of nitride semiconductor layers is formed on top of a substrate 10. The light-emitting structure member 100 further has a p-side electrode 70 and an n-side electrode 80 for supplying electric current to the semiconductor laser chip portion 50.

The semiconductor laser chip portion 50 at least includes an n-type nitride semiconductor layer 20, an active layer 30 formed of a nitride semiconductor, and a p-type nitride semiconductor layer 40, and in addition has the above-mentioned pair of resonator facets 110 and 120 (see FIG. 1). The semiconductor laser chip portion 50 is further provided with a stripe-shaped (elongate) ridge portion 55 extending in the direction (resonator direction) perpendicular to the resonator facets 110 and 120. The semiconductor laser chip portion 50 has a structure in which the n-type nitride semiconductor layer 20, the active layer 30, and the p-type nitride semiconductor layer 40 are stacked in this order from the substrate 10 side.

The substrate 10 may be formed of any of various materials such as, but not limited to, GaN, sapphire, SiC, GaAs, Si, AlN, AlGaN, InGaN, etc. In particular, using a GaN substrate formed of GaN helps enhance crystal quality during growth of a nitride semiconductor crystal, and thus helps enhance productivity. For this reason, it is preferable that the substrate 10 be formed of GaN.

Used as the principal growth plane (the plane on which the nitride semiconductor layers are grown) of the substrate 10 is, in a case where the crystal structure of the substrate 10 a hexagonal crystal system, a $\{0001\}$ plane, a $\{11\text{-}20\}$ plane, a $\{1\text{-}102\}$ plane, a $\{11\text{-}22\}$ plane, or the like and, in a case where the crystal structure of the substrate 10 is a cubic crystal system, a $\{001\}$ plane, a $\{111\}$ plane, a $\{110\}$ plane, or the like.

It is preferable that the resonator facets 110 and 120 be perpendicular to the principal growth plane of the substrate 10. In a case where the substrate 10 is a GaN substrate and its principal growth plane is a (0001) plane, the resonator facets 110 and 120 may each be a $\{1\text{-}100\}$ plane or a $\{11\text{-}20\}$ plane. Particularly preferable in a case where the resonator facets 110 and 120 are Rained by cleaving is, with consideration given to the flatness of the cleavage surface, a $\{1\text{-}100\}$ plane. In a case where the substrate 10 is a GaN substrate, and its principal growth plane is a $\{1\text{-}100\}$ plane, the resonator facets 110 and 120 may each be a $\{0001\}$ plane or a $\{11\text{-}20\}$ plane. Preferable in a case where the resonator facets 110 and 120 are formed by cleaving is, with consideration given to the flatness of the cleavage surface, a $\{11\text{-}20\}$ plane but, from the perspective of device characteristics such as threshold current, a $\{0001\}$ plane. A $\{0001\}$ plane is, however, difficult to cleave along and therefore, in such a case, instead of cleaving, dry etching may be used to form etched mirrors as the resonator facets.

The n-type nitride semiconductor layer 20 is composed of, for example, an n-type buffer layer, an n-type contact layer, an n-type clad layer, an n-type guide layer, etc. The n-type buffer layer and the n-type contact layer may be omitted. In a case where the substrate 10 is a GaN substrate, the n-type clad layer may be formed directly on top of the substrate 10. Any other of various structures may be adopted such as, but not limited to, by providing a hole block layer, or by partly including a layer of a conductivity type other than n-type. The n-type nitride semiconductor layer 20 contains, as an n-type impurity, any one or more of the group-IV elements, such as Si and O, the group-VI elements, etc. Preferable among these is Si. The impurity concentration may be in a range of about $5 \times 10^{16}$ cm$^{-3}$ to $1 \times 10^{21}$ cm$^{-3}$, and preferably in a range of about $1 \times 10^{17}$ cm$^{-3}$ to $5 \times 10^{18}$ cm$^{-3}$.

The p-type nitride semiconductor layer 40 is composed of, for example, a p-type carrier block layer, a p-type clad layer, a p-type guide layer, a p-type contact layer, etc. The p-type guide layer and the p-type contact layer may be omitted. Any other of various structures may be adopted such as, but not limited to, by providing an intermediate layer between the active layer 30 and the p-type carrier block layer, or by partly including a layer of a conductivity type other than the p-type. The p-type nitride semiconductor layer 40 contains, as a p-type impurity, any one or more of elements such as Mg and Zn. Preferable among these is Mg. The impurity concentration may be in a range of about $5\times10^{16}$ cm$^{-3}$ to $1\times10^{21}$ cm$^{-3}$, and preferably in a range of about $5\times10^{18}$ cm$^{-3}$ to $2\times10^{20}$ cm$^{-3}$.

As described above, the active layer 30 is provided between the n-type nitride semiconductor layer 20 and the p-type nitride semiconductor layer 40. It is preferable that the active layer 30 be give a quantum well structure having a well layer and a barrier layer. In this case, the active layer 30 may be given a multi-quantum well (MQW) structure. The type of impurity doping adopted here is preferably, but not limited to, non-doping or Si doping.

The n-type nitride semiconductor layer 20, the active layer 30, and the p-type nitride semiconductor layer 40 are formed of, for example, GaN, AlGaN, InGaN, AlN, InN, AlInGaN, or the like. To these may be added materials in which B (boron) is substituted as part of a group-III element, and materials in which P (phosphorus) or As (arsenic) is substituted as part of N (nitrogen) as a group-V element. What materials of what compositions with what thicknesses to use is determined with consideration given to factors such as laser wavelength band, light confinement, fabrication convenience, etc. Any of the layers may be fabricated by any of, or any combination of two or more of, various processes such as, but not limited to: vapor-phase growth processes such as a MOCVD (metal organic chemical vapor deposition) process, a MBE (molecular beam epitaxy) process, and a sputtering process; and liquid-phase growth processes such as a hydrothermal synthesis process—a process in which a crystal is grown in a supercritical fluid—and a flux process.

In the nitride semiconductor laser chip according to Embodiment 1, in at least part of the p-type nitride semiconductor layer 40, the above-mentioned stripe-shaped (elongate) ridge portion 55 is provided. The ridge portion 55 has a current constricting function, and also has a waveguide function whereby to confine light in the lateral direction by creating a difference in refractive index between inside and outside the stripe. The width of the ridge portion 55 is about 1.0 μm to 20.0 μm. In a case where single-mode laser light is needed, as in use as a light source in an optical disc system, it is preferable that the width of the ridge portion 55 be about 1.0 μm to 3.0 μm. In a case where multi-mode laser light will do, as in use in a display, to increase the maximum light output, the width of the ridge portion 55 is about 2.0 μm to 20.0 μm. The height of the ridge portion 55 is about 0.1 μm to 2.0 μm. The width and height of the ridge portion 55 greatly influence light confinement in the lateral direction, and are therefore set with that taken into consideration.

On the top surface of the semiconductor laser chip portion 50 (p-type nitride semiconductor layer 40), an insulating film 60 is formed. The insulating film 60 is so formed as to expose at least part of the top surface of the ridge portion 55. The insulating film 60 is formed of an oxide, nitride, oxynitride, or the like of Si, Ti, Ta, Al, Zr, Nb, Hf, Zn, or the like. The insulating film 60 may be formed to have a single layer or to have a stacked-layer structure. Any of the above-mentioned materials may be used in a monocrystalline form, in a polycrystalline form, in an amorphous form, or in a mixed state of any of these. With consideration given to ease of production, adhesion, and thermal stability, it is preferable that the insulating film 60 be formed of an oxide of Si, an oxide of Zr, a nitride of Al, a nitride of Si, a stacked structure of an oxide of Si and an oxide of Ti, or the like. The thickness of the insulating film 60 is about 50 Å to 5000 Å.

On the top surface of the insulating film 60, the p-side electrode 70 is formed, which lies in contact with the p-type nitride semiconductor layer 40. The p-side electrode 70 is formed of a metal such as Pd (palladium), Ni (nickel), Pt (platinum), Au (gold), Mo (molybdenum), Ir (iridium), or Rh (rhodium), or an alloy of any of these. The p-side electrode 70 may be fanned to have a single layer or to have a stacked-layer structure. Preferable among others are the combinations Pd/Mo, Ni/Au, Ni/Au/Pt, and Ni/Au/Pd (with the layers stacked in the order named from the semiconductor side) for their low contact resistance and high stability. In a case where the p-side electrode 70 is formed to have a stacked-layer structure, the thickness of each layer is about 50 Å to 5000 Å.

In a case where the substrate 10 is an electrically conductive substrate such as a GaN substrate, as shown in FIG. 2, the n-side electrode 80 may be fanned over the entire back surface (the surface opposite from that on which the nitride semiconductor layers are stacked) of the substrate 10. On the other hand, in case where the substrate 10 is an electrically insulating substrate such as a sapphire substrate, the n-side electrode needs to be formed on a part of the n-type nitride semiconductor layer 20 exposed by etching. Thus, with consideration given to ease of production, it is preferable that a GaN substrate be used as the substrate 10.

The n-side electrode 80 is formed of a metal such as Hf, Al, Mo, Pt, Au, W (tungsten), Ti (titanium), or Cr (chromium), or an alloy of any of these. The n-side electrode 80 may be formed to have a single layer or to have a stacked-layer structure. Preferable among others are the combinations Hf/Al/Mo/Pt/Au and Ti/Pt/Au (with the layers stacked in the order named from the semiconductor side) for their low contact resistance and high stability. In a case where the n-side electrode 80 is formed to have a stacked-layer structure, the thickness of each layer is about 50 Å to 5000 Å.

With consideration given to convenience at the stage of mounting, the insulating film 60, the p-side electrode 70, and the n-side electrode 80 may be patterned as necessary. The thickness, shape, pattern, etc. of the insulating film 60, the p-side electrode 70, and the n-side electrode 80 may be changed as necessary, so long as these fulfill their respective functions. For example, the p-side electrode 70 may be so shaped as to additionally cover part or the whole of the side surfaces of the ridge portion 55. This structure helps reduce the operating voltage.

The resonator length of the nitride semiconductor laser chip may be about 300 μm to 3000 μm, and more preferably about 400 μm to 1000 μm. The chip width of the nitride semiconductor laser chip may be about 100 μm to 1000 μm, and more preferably about 150 μm to 400 μm.

In Embodiment 1, as described above, in the coating film 200 formed on the light-emission-side resonator facet 110, in a region contiguous with the resonator facet 110 and in the vicinity thereof, the low-Ar region 210 with a low Ar content is provided and, on the coating film 200's surface side of this low-Ar region 210 (on the side opposite from the resonator facet 110), the high-Ar region 220 with a high Ar content is provided. This makes it possible to enhance reliability at high output.

The reasons are considered to be as follows. In the vicinity of the light-emission-side resonator facet 110, heating resulting from light absorption in the coating film 200 influences the nitride semiconductor layers such as the active layer 30, and thereby adversely affects device characteristics and reliability. Accordingly, in the vicinity of the resonator facet 110, higher priority is given to minimizing the amount of Ar absorbed to reduce light absorption than to forming a closely-packed film. On the other hand, on the coating film 200's surface side (on the side opposite from the resonator facet 110), it is more important to suppress diffusion of moisture and oxygen from the atmosphere than to suppress light absorption. To that end, it is preferable to hold the Ar partial pressure during film formation low and form a closely-packed film. These are the reasons, it is considered, that an effect of enhancing reliability at high output is brought about when, within the coating film 200, the low-Ar region 210 is provided in a region contiguous with the resonator facet 110 and in the vicinity thereof and the high-Ar region 220 is provided on the coating film 200's surface side of that low-Ar region 210.

By providing the low-Ar region 210 in the vicinity of the resonator facet 110 and thereby suppressing light absorption in the vicinity of the resonator facet, it is possible to suppress heating in the low-Ar region 210 resulting from light absorption, and thus it is possible to suppress a rise in facet temperature at the resonator facet 110. It is thus possible to suppress the inconvenience of proliferation of non-radiative recombination centers resulting from a rise in facet temperature. In this way, it is possible to suppress excessive heating of the resonator facet 110 resulting from proliferation of non-radiative recombination centers, and thereby to suppress deterioration of the resonator facet 110.

By forming the high-Ar region 220, for suppressing diffusion of moisture and oxygen from the atmosphere, on the coating film 200's surface side of the low-Ar region 210 is (on the side opposite from the resonator facet 110), it is possible to suppress moisture and oxygen from outside permeating through the coating film 200 and penetrating to the light-emission-side resonator facet 110. In this way, it is possible to suppress oxidation of the resonator facet 110, and thus it is possible to suppress proliferation of non-radiative recombination centers resulting from oxidation of the resonator facet 110. In this way too, it is possible to suppress excessive heating of the resonator facet 110, and thereby to suppress deterioration of the resonator facet 110.

As described above, in Embodiment 1, the low-Ar region 210 contiguous with the resonator facet 110 is assigned the function of suppressing absorption of laser light, and the high-Ar region 220 arranged on the coating film 200's surface side is assigned the function of suppressing diffusion of moisture and oxygen from the atmosphere to the resonator facet 110; this makes it possible to effectively enhance the COD level. Thus, even in operation at higher output, it is possible to easily suppress deterioration of the resonator facet 110 ascribable to optical damage. Consequently, it is possible to obtain sufficient reliability even at high output as mentioned above.

If moisture diffuses into a coating film, the moisture inside the coating film not only itself absorbs laser light but also, by a not well understood mechanism, forms absorption centers inside the coating film to absorb laser light. In Embodiment 1, however, owing to the structure that suppresses diffusion of moisture into the coating film 200 as described above, it is possible to easily suppress light absorption in the coating film 200 resulting from diffusion of moisture.

In Embodiment 1, not only on the light-emission-side resonator facet 110, but also on the light-reflection-side resonator facet 120, the coating film 300 including the low-Ar region 310 and the high-Ar region 320 is fanned, and thus, also at the resonator facet 120, it is possible to obtain an effect of suppressing facet deterioration as at the light-emission-side resonator facet 110. In this way, it is possible to enhance reliability even in operation at higher output. That is, when the nitride semiconductor laser chip is operated at higher output, not only the light-emission-side resonator facet 110 but also the light-reflection-side resonator facet 120 may affect reliability; thus, adopting the above structure makes it possible to further enhance reliability.

In Embodiment 1, by forming the high-Ar region 220 with a greater thickness in the thickness direction of the coating film 200 than the low-Ar region 210, it is possible to effectively suppress moisture and oxygen from outside permeating through the coating film 200 and penetrating to the resonator facet 110, and thus it is possible to effectively suppress oxidation of the resonator facet 110. In this way, it is possible to easily suppress proliferation of non-radiative recombination centers resulting from oxidation of the resonator facet 110, and thus it is possible to easily suppress excessive heating of the resonator facet 110. Consequently, it is possible to suppress deterioration of the resonator facet 110 more easily. The coating film 300 formed on the light-reflection-side resonator facet 120 has a similar effect to the coating film 200 formed on the light-emission-side resonator facet 110.

Next, with reference to FIGS. 1 and 2, a method of manufacture of a nitride semiconductor laser chip according to Embodiment 1 will be described.

First, a light-emitting structure member 100 is formed that has a semiconductor laser chip portion 50 stacked on top of a substrate 10. Specifically, as shown in FIG. 2, by a crystal growth process such as a MOCVD process, on top of the substrate 10, an n-type nitride semiconductor layer 20, an active layer 30, and a p-type nitride semiconductor layer 40 are grown successively. The formation of the semiconductor laser chip portion 50 may be achieved by, other than a MOCVD process, any of various processes such as: vapor-phase growth processes such as a sputtering process; and liquid-phase processes such as a hydrothermal synthesis process—a process in which a crystal is grown in a supercritical fluid—and a flux process. As by combining two or more of these growth methods, it is possible to adopt any of various methods with no limitation.

Next, by a photolithography technology and an etching technology or the like, a stripe-shaped (elongate) ridge portion 55 is formed in at least part of the p-type nitride semiconductor layer 40. Then, by any of various vapor deposition processes, a sputtering process, a CVD (chemical vapor deposition) process, or the like, on the top surface of the semiconductor laser chip portion 50; an insulating film 60 is formed so as to cover side surface parts of the ridge portion 55.

Subsequently, by any of various vapor deposition processes, a sputtering process, a CVD process, or the like, on the insulating film 60, a p-side electrode 70 that lies in contact with the p-type nitride semiconductor layer 40 is formed. At this time, for better characteristics, after the metal film is formed, an annealing process may be performed at a temperature of about 100° C. to 500° C. Performing such an annealing process helps obtain a satisfactory ohmic electrode.

Thereafter, to make the substrate 10 easy to split, the back surface (the surface opposite from that on which the semiconductor laser chip portion 50 is formed) of the substrate 10 is ground or polished until the thickness of the substrate 10 is reduced to about 70 µm to 300 µm.

Then, by any of various vapor deposition processes, a sputtering process, a CVD process, or the like, on the back surface of the substrate 10, an n-side electrode 80 is formed. Before the n-side electrode 80 is formed, the back surface of the substrate 10 may be cleaned by dry etching, ashing, reverse sputtering, or the like to increase the adhesion between the n-side electrode 80 and the substrate 10. As with the p-side electrode 70, for better characteristics, after the metal film is formed, an annealing process may be performed at about 100° C. to 500° C. As with the p-side electrode 70, performing such an annealing process helps obtain a satisfactory ohmic electrode.

Through the procedure (wafer process) described above, a wafer containing a plurality of light-emitting structure members 100 is formed.

Next, the wafer obtained through the procedure described above is split into bars by cleaving (bar separation), thereby to form a pair of resonator facets 110 and 120, which are cleavage surfaces. Specifically, first, on at least one of the top and back surfaces of the wafer, scribing lines are formed with a diamond point or the like. At this time, it is preferable that the regions in which to form the scribing lines be patterned with an electrode or the like. Patterning and bar separation positions may be so adjusted that no part of the p-side electrode 70 (see FIG. 2) is formed near the resonator facets. Adopting such a structure may help enhance device characteristics. The scribing lines formed here serve as guide lines for cleaving. Instead of scribing, dry etching or the like may be used to form grooves beforehand. The scribing lines need to be formed at least in an edge (outer) part of the wafer; forming them in the shape of broken lines in an inner part of the wafer helps enhance the straightness of cleaving. After the scribing lines are formed, an appropriate force is applied to the wafer to perform cleaving. It is preferable that the cleavage surfaces be perpendicular to the principal growth plane (on which the nitride semiconductor layers are grown) of the substrate 10 (see FIG. 2).

At this time, the bar separation positions determine the resonator length of the nitride semiconductor laser chip. As mentioned above, the resonator length may be about 300 µm to 3000 µm, and more preferably about 400 µm to 1000 µm.

Next, as shown in FIG. 1, on the resonator facets 110 and 120 formed by bar separation, coating films 200 and 300 are formed respectively.

The formation of the coating films 200 and 300 may be achieved by any of various sputtering processes such as an ECR (electron cyclotron resonance) sputtering process or a magnetron sputtering process. Two or more such processes may be combined. Preferable among others is an ECR sputtering process, because it allows formation of coating films with good film quality and it allows easy stable control of the amount of Ar absorbed. At least either before or after film formation, plasma irradiation using a gas such as argon, oxygen, nitrogen, hydrogen, or a mixed gas of any selected from those gases, or heating, may be performed.

Here, in the method of manufacture according to Embodiment 1, when the light-emission-side coating film 200 is formed, in a region contiguous with the resonator facet 110 and in the vicinity thereof, a low-Ar region 210 with a low Ar content is provided and, on the coating film 200's surface side of this low-Ar region 210 (on the side opposite from the resonator facet 110), a high-Ar region 220 with a higher Ar content than the low-Ar region 210 is provided. Likewise, when the light-reflection-side coating film 300 is formed, in a region contiguous with the resonator facet 120 and in the vicinity thereof, a low-Ar region 310 with a low Ar content is provided and, on the coating film 300's surface side of this low-Ar region 310 (on the side opposite from the resonator facet 310), a high-Ar region 320 with a higher Ar content than the low-Ar region 310 is provided.

The amount of Ar absorbed into a coating film can be reduced, for example, by increasing the flow amount of Ar introduced during film formation. This reduces the mean free path length of Ar atoms, and thereby reduces the amount of Ar absorbed into the coating film.

Reducing the amount of Ar absorbed into a coating film reduces absorption of laser light. Thus, a coating film with a low Ar content (the low-Ar regions 210 and 310) is suitable as a coating film provided in the vicinity of a resonator facet, where light density is high.

On the other hand, reducing the flow amount of Ar introduced during film formation increases the mean free path length of Ar atoms, and thus increases the amount of Ar absorbed into the coating film. In exchange, a closely-packed coating film is obtained. Thus, a coating film with a high Ar content (the high-Ar regions 220 and 320) is suitable as a coating film provided on the surface side, rather than in the vicinity of a resonator facet.

Incidentally, the amount of Ar absorbed depends not only on the flow amount of Ar introduced during film formation but also film formation temperature, film formation speed, etc. For example, a slow film formation speed increases the amount of Ar absorbed. Thus, the amount of Ar absorbed can be controlled through overall control of different conditions like those.

The amounts of Ar absorbed into the coating films 200 and 300 can be determined by, for example, Auger electron spectroscopy (AES), X-ray photoelectron spectroscopy (XPS), energy dispersive X-ray analysis (EDX), etc.

Thereafter, on the coating film 300 formed on the resonator facet 120 on the light reflection side, a high-reflectance multilayer film 330 having a multi-layer structure is formed.

Subsequently, each bar (bar-shaped array of chips, not shown) having the coating films 200 and 300 formed on it is split into chips (chip separation). At this time, the chip separation positions determine the chip width. As mentioned above, the chip width may be about 100 µm to 1000 µm, and more preferably about 150 µm to 400 µm. The chip separation can be achieved by a scribing process similar to that used for bar separation. It is preferable that chip separation be performed in the direction perpendicular to the direction of bar separation.

In this way, a nitride semiconductor laser chip according to Embodiment 1 is manufactured.

The nitride semiconductor laser chip obtained by the above method of manufacture is electrically connected, with solder, silver paste, or the like, to a stem provided with a positive (+, plus) terminal and a negative (−, minus) terminal. In a case where the nitride semiconductor laser chip is mounted junction up, the n-side electrode 80 is electrically connected to the stem body, and the p-side electrode 70 is connected to the positive terminal via a bonding wire. The nitride semiconductor laser chip may instead be mounted junction down, that is, with the p-side electrode 70 down and connected to the stem body and with wire bonding done on the n-side electrode 80. For enhanced heat dissipation, a sub-mount may be provided between the nitride semiconductor laser chip and the stem. In that case, the n-side electrode 80 is electrically connected to the sub-mount, and in addition the sub-mount is wire-bonded to the negative terminal of the stem. After wire bonding, sealing (encapsulating) into a cap in a dry air atmosphere completes assemblage into a can-packaged semiconductor laser device.

The nitride semiconductor laser chip according to Embodiment 1 of the invention will now be described in more detail by way of practical examples.

PRACTICAL EXAMPLE 1-1

Figure 3:
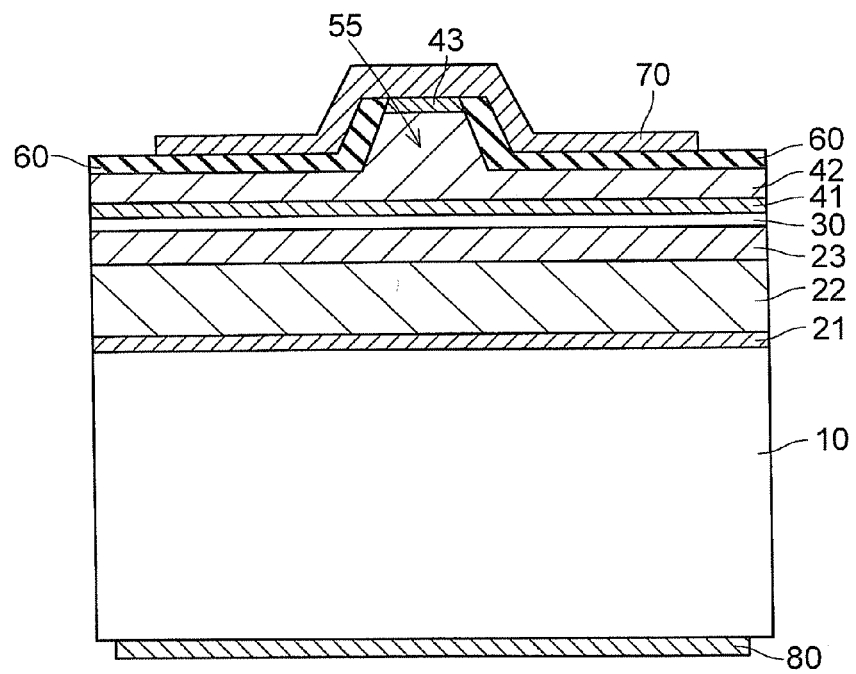
FIG. 3 is a sectional view schematically showing the structure of a nitride semiconductor laser chip according to Practical Example 1-1.
Figure 4:
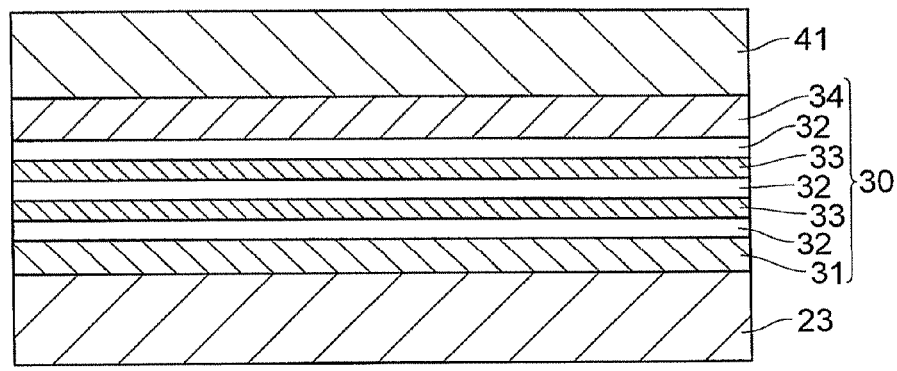
FIG. 4 is a sectional view illustrating the structure of an active layer in a nitride semiconductor laser chip according to Practical Example 1-1.
Figure 5:
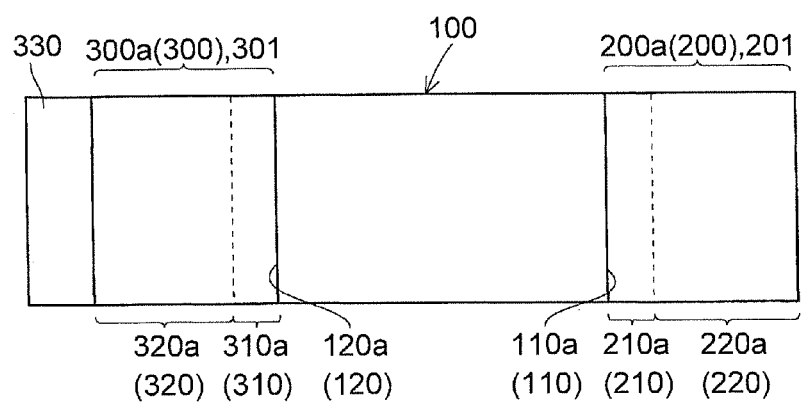
FIG. 5 is a side view schematically showing a nitride semiconductor laser chip according to Practical Example 1-1.

FIG. 3 is a sectional view schematically showing the structure of a nitride semiconductor laser chip according to Practical Example 1-1. FIG. 4 is a sectional view illustrating the structure of an active layer in the nitride semiconductor laser chip according to Practical Example 1-1. FIG. 5 is a side view schematically showing the nitride semiconductor laser chip according to Practical Example 1-1. First, with reference to FIGS. 2 to 5, the nitride semiconductor laser chip according to Practical Example 1-1 will be described.

In the nitride semiconductor laser chip according to Practical Example 1-1, as shown in FIG. 3, an n-type GaN substrate was used as the substrate 10. The crystal orientation of the principal growth plane of the substrate 10 was a (0001) plane.

In Practical Example 1-1, the n-type nitride semiconductor layer 20 (see FIG. 2) included an n-type GaN layer 21, an n-type clad layer, and an n-type guide layer 23, and the p-type nitride semiconductor layer 40 (see FIG. 2) included a carrier block layer 41, a p-type clad layer 42, and a p-type contact layer 43. Specifically, on top of the substrate 10, by a MOCVD process, the following layers were formed successively: an n-type GaN layer 21 with a thickness of 0.1 μm (100 nm); an n-type clad layer 22 of n-type $Al_{0.05}Ga_{0.95}N$ with a thickness of 2.2 μm (2200 nm); an n-type guide layer 23 of n-type GaN with a thickness of 0.02 μm (20 nm); an active layer 30; a carrier block layer 41 of p-type $Al_{0.30}Ga_{0.70}N$ with a thickness of 0.015 μm (15 nm); a p-type clad layer 42 of p-type $Al_{0.05}Ga_{0.95}N$ with a thickness of 0.55 μm (550 nm); and a p-type contact layer 43 of p-type GaN with a thickness of 0.1 μm (100 nm).

The active layer 30 was formed in the following manner: as shown in FIG. 4, first, on the n-type guide layer 23, a first barrier layer 31 of $In_{0.03}Ga_{0.97}N$ with a thickness of 20 nm was formed; then, on the first barrier layer 31, three quantum well layers 32 of $In_{0.10}Ga_{0.90}N$ with a thickness of 5.5 nm and two second bather layers 33 of $In_{0.03}Ga_{0.97}N$ with a thickness of 8 nm were formed alternately. Then, on the topmost quantum well layer 32, a GaN layer 34 with a thickness of 70 nm was formed. Thus, in Practical Example 1-1, the active layer 30 was given a multi-quantum well structure including three quantum well layers 32. None of the constituent layers of the active layer 30 was doped.

The source materials for the growth of these nitride semiconductors were as follows: used as source materials for Group-III elements were trimethylgallium (($CH_3)_3Ga$, TMGa), trimethylindium (($CH_3)_3In$, TMIn), and trimethylaluminium (($CH_3)_3Al$, TMAl); and used as a source material for a Group-V element was ammonia ($NH_3$). The impurity doping elements for the control of conductivity type were as follows: for n-type, Si, with silane ($SiH_4$) used as a source material; for p-type, Mg, with cyclopentadienylmagnesium ($CP_2Mg$) used as a source material. The amounts of doping were as follows: in the n-type clad layer 22, $4\times10^{18}$ $cm^{-3}$; in the n-type guide layer 23, $1\times10^{18}$ $cm^{-3}$; in the carrier block layer 41, $1\times10^{19}$ $cm^{-3}$; and in both the p-type clad layer 42 and the p-type contact layer 43, $5\times10^{18}$ $cm^{-3}$. The growth temperatures were as follows: for the n-type nitride semiconductor layer 20 (see FIG. 2), 1025° C.; for the active layer 30, 780° C.; and for the p-type nitride semiconductor layer 40 (see FIG. 2), 1075° C.

The ridge portion 55 shown in FIG. 3 was formed by an ICP (inductively coupled plasma) dry etching process employing photolithography. The width of the ridge portion 55 was 1.7 μm. The ridge portion 55 was formed to extend in the [1-100] direction.

Subsequently, on the p-type nitride semiconductor layer 40 (see FIG. 2), an insulating film 60 was formed. The insulating film 60 was given a two-layer structure of $SiO_2/TiO_2$. The thicknesses were 170 nm/50 nm. The film formation employed an EB (electron beam) vapor deposition process. After film formation, by a photolithography technology or the like, the insulating film 60 was formed into a predetermined pattern.

Next, a p-side electrode 70 having a stacked structure of Pd/Mo/Au was formed on the insulating film 60. The thicknesses in the p-side electrode 70 were 50 nm/15 nm/200 nm. The film formation employed an EB (electron beam) vapor deposition process. After film formation, by a photolithography technology or the like, the p-side electrode 70 was formed into a predetermined pattern.

After formation of the p-side electrode 70, by use of a grinding machine and a polishing machine, the thickness of the substrate 10 (the wafer thickness) was adjusted to be 120 μm. Thereafter, as an n-side electrode 80, layers of Hf/Al/Mo/Pt/Au were formed on the back surface of the substrate 10 by an EB vapor deposition process. The thicknesses were 5 nm/150 nm/36 nm/18 nm/250 nm. Then, after formation of the metal films (after formation of the p-side electrode 70 and the n-side electrode 80), an annealing process was performed at 500° C., so that a satisfactory ohmic electrode was obtained.

Thereafter, by cleaving, the wafer was split into bars in the direction parallel to a [11-20] direction. This produced a pair of resonator facets 110a (110) and 120a (120) opposite each other as shown in FIG. 5. The crystal orientation of the resonator facets 110a and 120a was a {1-100} plane. The bar separation was done so that the resonator length was 800 μm.

Subsequently, by an ECR sputtering process, coating films were formed on the resonator facets.

Here, in Practical Example 1-1, the coating film 200a (200) formed on the light-emission-side resonator facet 110a was formed of an $Al_2O_3$ film 201. That is, on the light-emission-side resonator facet 110a, a coating film 200a composed of a single film was formed. Moreover, the light-emission-side coating film 200a included two regions, namely a low-Ar region 210a (210) contiguous with the resonator facet 110a and a high-Ar region 220a (220). In this way, in Practical Example 1-1, the coating film 200a was so formed that the low-Ar region 210a and the high-Ar region 220a were formed of the same material. The low-Ar region 210a and the high-Ar region 220a differ only in Ar content.

The single-film coating film 200a formed of the $Al_2O_3$ film 201 was formed by an ECR sputtering process with Al as a target. Specifically, first, the low-Ar region 210a was formed under the following conditions: Ar gas flow amount, 40.0 sccm; $O_2$ gas flow amount, 5.7 sccm; microwave power, 500 W; and RF power, 500 W. At this time, the film formation rate was 2.6 Å/sec. The thickness of the low-Ar region 210a (its thickness in the thickness direction of the coating film 200a) was 20 nm. Next, the high-Ar region 220a was formed under the following conditions: Ar gas flow amount, 20.0 sccm; $O_2$ gas flow amount, 5.0 sccm; microwave power, 700 W; and RF power, 700 W. At this time, the film formation rate was 3.2 Å/sec. The thickness of the high-Ar region 220a (its thickness in the thickness direction of the coating film 200a) was 220 nm. Thus, the thickness of the coating film 200a was 240 nm. The film formation temperature of both the low-Ar region 210a and the high-Ar region 220a was about 200° C.

In Practical Example 1-1, also on the light-reflection-side resonator facet 120a, a single-film coating film 300a (300) formed of an $Al_2O_3$ film 301 was formed. This light-reflection-side coating film 300a too included a low-Ar region 310a (310) continuous with the resonator facet 120a and a high-Ar region 320a (320). That is, also in the light-reflection-side coating film 300a, the low-Ar region 310a and the high-Ar region 320a were formed of the same material. The low-Ar region 310a and the high-Ar region 320a differ only in Ar content.

The low-Ar region 310a was formed under the same conditions as the low-Ar region 210a formed on the light-emission-side resonator facet 110a. The thickness of the low-Ar region 310a (its thickness in the thickness direction of the coating film 300a) was, like that of the low-Ar region 210a, 20 nm. Also, the high-Ar region 320a was formed under the same conditions as the high-Ar region 220a formed on the light-emission-side resonator facet 110a. The thickness of the high-Ar region 320a (its thickness in the thickness direction of the coating film 300a) was, unlike that of the high-Ar region 220a, 100 nm. Thus, on the light reflection side, the thickness of the coating film 300a was 120 nm.

On the light-reflection-side coating film 300a, by an EB vapor deposition process, a high-reflectance multi-layer film 330 was formed. The high-reflectance multi-layer film 330 was formed by forming three cycles of a silicon oxide ($SiO_2$) film/a titanium oxide ($TiO_2$) film with thicknesses of 68 nm/44 nm.

The structure above gave the following reflectances at the design lasing wavelength of 405 nm: on the light emission side, 18%; and on the light reflection side, 95%. Before the coating films 200a and 300a were formed, heating at 200° C. was performed for 10 minutes for cleaning, followed by Ar plasma irradiation for 5 minutes.

Thereafter, chip separation was done so that the chip width was 180 µm, and in this way the nitride semiconductor laser chip according to Practical Example 1-1 was obtained.

Then, the nitride semiconductor laser chip thus obtained was mounted on a can-packaged semiconductor laser device, and then the nitride semiconductor laser chip according to Practical Example 1-1 was tested for its characteristics. The results were as follows: it lased continuously at a room temperature of 25° C. with a threshold current value of 40 mA, and the lasing wavelength was 405 nm.

In the nitride semiconductor laser chip according to Practical Example 1-1, forming the low-Ar region 210a and the high-Ar region 220a in the coating film 200a out of the same material as described above makes it easy to form the coating film 200a including the low-Ar region 210a and the high-Ar region 220a. This makes it possible to obtain, with satisfactory productivity, a nitride semiconductor laser chip that offers sufficient reliability even at high output. Forming also the low-Ar region 310a and the high-Ar region 320a in the coating film 300a out of the same material makes it possible to obtain, with higher productivity, a nitride semiconductor laser chip that offers sufficient reliability even at high output.

Next, to inspect the high-output characteristics of the nitride semiconductor laser chip according to Practical Example 1-1, it was subjected to measurement of the current-optical output (IL) response. As comparative examples, three types of nitride semiconductor laser chips (Comparative Examples 1 to 3) were fabricated with the light-emission-side coating film structured differently, and these too were, as that of Practical Example 1-1 was, subjected to measurement of the current-optical output (IL) response.

The material of the light-emission-side coating film in Comparative Examples 1 to 3 was $Al_2O_3$ as in Practical Example 1-1.

In Comparative Example 1, the light-emission-side coating film included a high-Ar region alone. The thickness of the coating film was 240 nm, like that of the coating film 200a in Practical Example 1-1 (the total thickness of the low-Ar region 210a and the high-Ar region 220a). In Comparative Example 1, the light-emission-side coating film was formed under the same conditions as the high-Ar region 220a in the Practical Example 1-1.

In Comparative Example 2, the light-emission-side coating film included a low-Ar region alone. The thickness of the coating film was 240 nm, like that in Practical Example 1-1 and in Comparative Example 1. In Comparative Example 2, the light-emission-side coating film was formed under the same conditions as the low-Ar region 210a in the Practical Example 1-1.

In Comparative Example 3, the light-emission-side coating film included a low-Ar region and a high-Ar region, and the low-Ar region and the high-Ar region were arranged in the reverse order compared with those in Practical Example 1-1. Specifically, on the light-emission-side resonator facet side, contiguous with this resonator facet, the high-Ar region was formed with a thickness of 220 nm, and further on top of this region (on the side opposite from the resonator facet), the low-Ar region was formed with a thickness of 220 nm. In Comparative Example 3, of the light-emission-side coating film, the high-Ar region was formed under the same conditions as the high-Ar region 220a in Practical Example 1-1, and the low-Ar region was formed under the same conditions as the low-Ar region 210a in Practical Example 1-1.

Except for the structure of the light-emission-side coating film, the structures in Comparative Examples 1 to 3 were similar to that in Practical Example 1-1.

Figure 6:
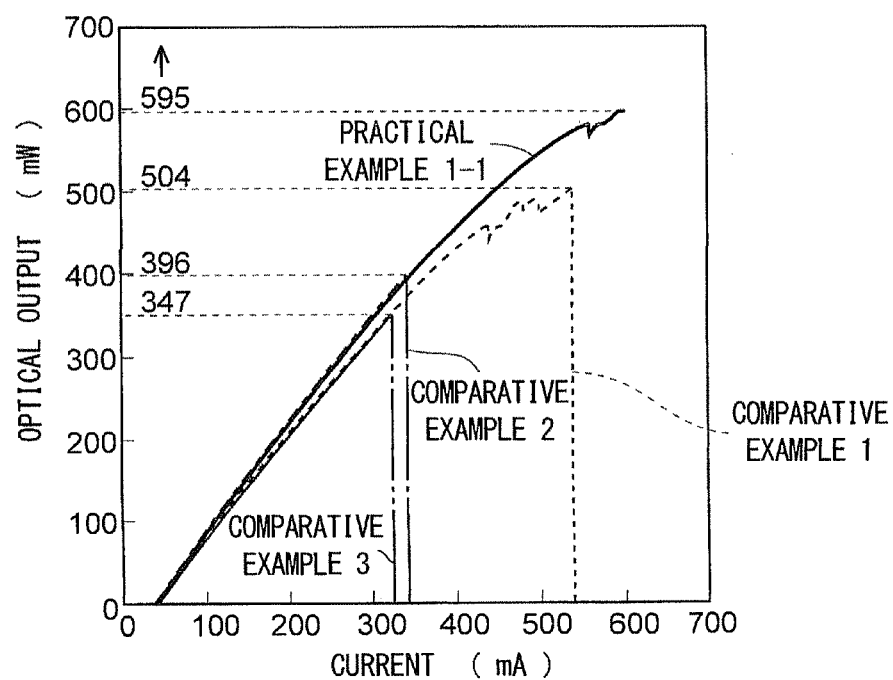
FIG. 6 is a graph showing the current-optical output (IL) response of a nitride semiconductor laser chip according to Practical Example 1-1.

FIG. 6 is a graph showing the current-optical output (IL) response of the nitride semiconductor laser chip according to Practical Example 1-1. In FIG. 6, the value of the current (mA) fed to the nitride semiconductor laser chip is taken on the horizontal axis, and the optical output (mW) of the laser light corresponding to the fed current is taken on the vertical axis. FIG. 6 shows, in addition to the IL response of the nitride semiconductor laser chip according to Practical Example 1-1, the IL response of the nitride semiconductor laser chips of Comparative Examples 1 to 3 as well. In FIG. 6, the solid line represents the IL response of the nitride semiconductor laser chip according to Practical Example 1-1; the broken line represents the IL response of the nitride semiconductor laser chip according to Comparative Example 1; the dash-dot line represents the IL response of the nitride semiconductor laser chip according to Comparative Example 2; and the dash-dot-dot line represents the IL response of the nitride semiconductor laser chip according to Comparative Example 3.

FIG. 6 shows the following. The nitride semiconductor laser chip according to Practical Example 1-1 did not cease to lase even at an optical output of 595 mW, and thus had superb high-output characteristics. By contrast, in all of Comparative Examples 1 to 3, lasing ceased at optical outputs lower than 595 mW. Specifically, in Comparative Example 1, lasing ceased at an optical output of 504 mW; in Comparative Example 2, lasing ceased at an optical output of 396 mW; and in Comparative Example 3, lasing ceased at an optical output of 347 mW. Thus, the nitride semiconductor laser chip according to Practical Example 1-1 had a lasing cease optical output higher than any of the nitride semiconductor laser chips according to Comparative Examples 1 to 3.

Next, to determine the amount of Ar contained in the coating film 200a, AES measurement was performed. The amount of Ar was calculated, based on the signal intensity obtained from the AES measurement, through conversion of the signal intensity to atom concentrations with consideration given to the sensitivities with respect to Al (aluminum), O (oxygen), and Ar (argon) respectively such that the total of the three kinds of atoms, namely Al, O, and Ar, equaled 100% by number of atoms.

The results were as follows: the Ar contents in the coating film 200a according to Practical Example 1-1 were, in the low-Ar region 210a, 2% by number of atom and, in the high-Ar region 220a, 4% by number of atoms.

In addition to the AES measurement mentioned above, EDX measurement also was performed to measure the Ar content in the coating film.

Figure 7:
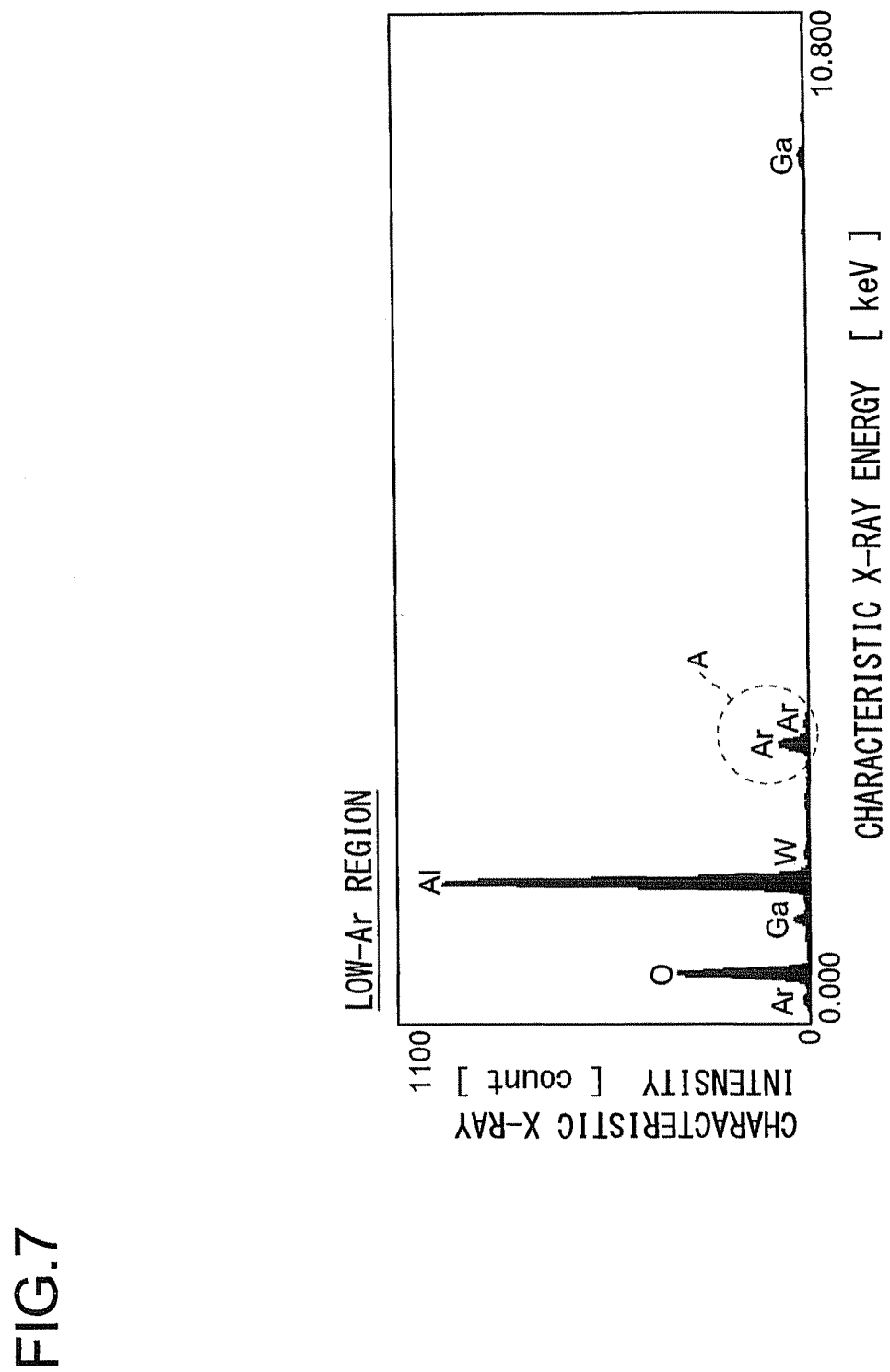
FIG. 7 is a graph showing the results of EDX measurement on a light-emission-side coating film in a nitride semiconductor laser chip according to Practical Example 1-1.
Figure 8:
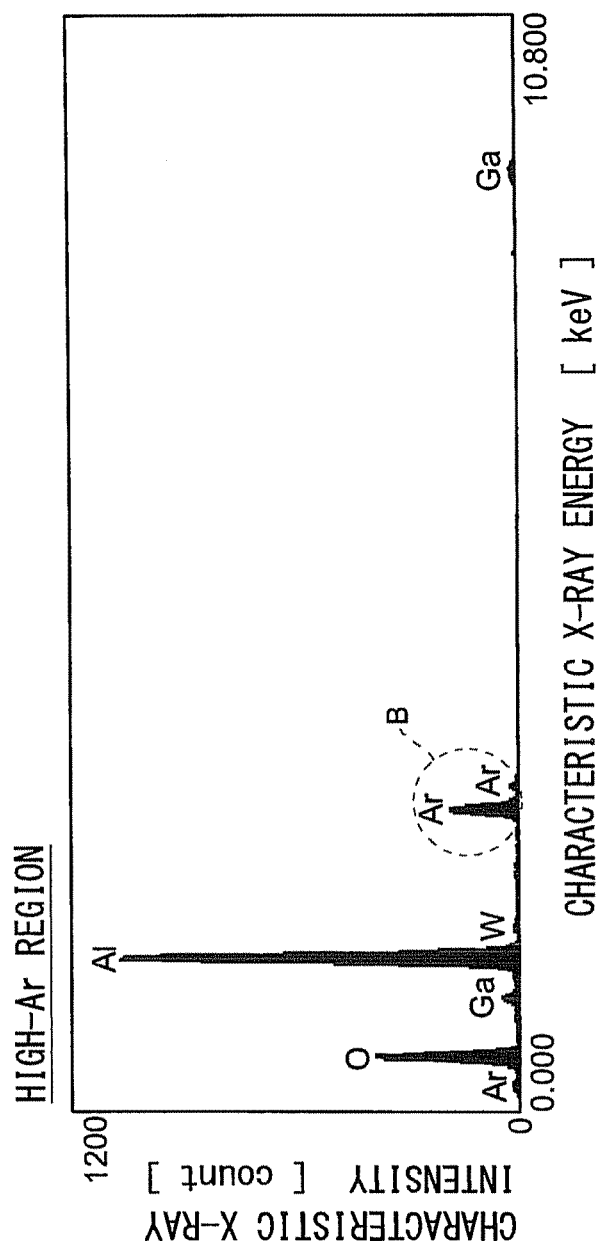
FIG. 8 is a graph showing the results of EDX measurement on a light-emission-side coating film in a nitride semiconductor laser chip according to Practical Example 1-1.

FIGS. 7 and 8 are graphs showing the results of EDX measurement on the light-emission-side coating film in the nitride semiconductor laser chip according to Practical Example 1-1. FIG. 7 shows the results of EDX measurement on the low-Ar region 210a (see FIG. 5), and FIG. 8 shows the results of EDX measurement on the high-Ar region 220a (see FIG. 5).

Comparing the Ar signal intensity enclosed in the broken-line circle A in FIG. 7 with the Ar signal intensity enclosed in the broken-line circle B in FIG. 8 reveals that, although the low-Ar and high-Ar regions were both parts of the $Al_2O_3$ film 201, the Ar signal intensity in the low-Ar region shown in FIG. 7 was lower than the Ar signal intensity in the high-Ar region shown in FIG. 8. Thus, EDX measurement too revealed that the Ar content in the low-Ar region was lower than the Ar content in the high-Ar region.

The foregoing confirms the following: by providing the low-Ar region 210 with a low Ar content contiguous with the resonator facet 110a and providing on top of the low-Ar region 210a (on the side opposite from the resonator facet 110a) the high-Ar region 220a with a high Ar content, it is possible to obtain sufficiently high reliability even at high output.

PRACTICAL EXAMPLE 1-2

Figure 9:
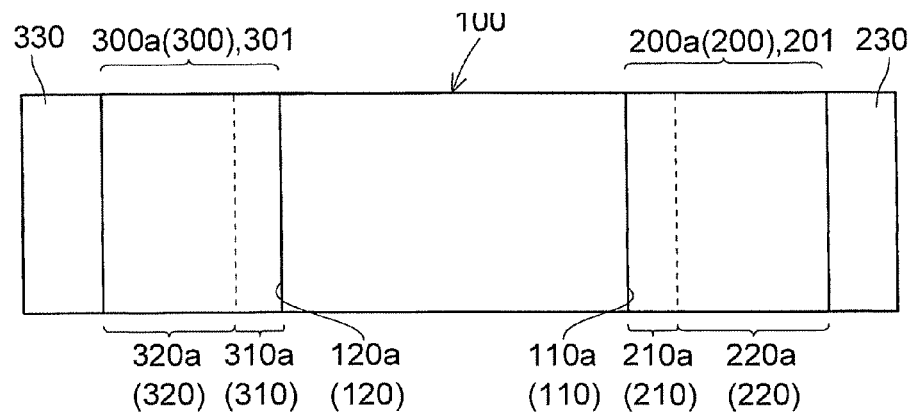
FIG. 9 is a side view schematically showing a nitride semiconductor laser chip according to Practical Example 1-2 of the invention.

FIG. 9 is a side view schematically showing a nitride semiconductor laser chip according to Practical Example 1-2. Next, with reference to FIGS. 4 and 9, the nitride semiconductor laser chip according to Practical Example 1-2 will be described.

In the nitride semiconductor laser chip according to Practical Example 1-2, the In composition in the quantum well layers in the active layer differed from that in Practical Example 1-1. Specifically, whereas in Practical Example 1-1 the quantum well layers 32 (see FIG. 4) were formed of $In_{0.10}Ga_{0.90}N$, in Practical Example 1-2 the quantum well layers were formed of $In_{0.18}Ga_{0.82}N$. Accordingly, in Practical Example 1-2, the lasing wavelength was 445 nm.

In Practical Example 1-2, as shown in FIG. 9, on the light-emission-side coating film 200a (200), a high-reflectance multi-layer film 230 was formed. The high-reflectance multi-layer film 230 was formed by forming two cycles of a silicon oxide ($SiO_2$) film/a silicon nitride (SiN) film with thicknesses of 75 nm/53 nm by an ECR sputtering process with Si as a target. The $SiO_2$ film was formed under the following conditions: Ar gas flow amount, 20.0 sccm; $O_2$ gas flow amount, 6.5 sccm; microwave power, 500 mW; and RF power, 500 W. At this time, the film formation rate was 2.6 Å/sec. The SiN film was formed under the following conditions: Ar gas flow amount, 40.0 sccm; $N_2$ gas flow amount, 5.0 sccm; microwave power, 500 mW; and RF power, 500 W. At this time, the film formation rate was 1.5 Å/sec. The film formation temperature of both the $SiO_2$ film and the SiN film was about 200° C.

In Practical Example 1-2, in the high-reflectance multi-layer film 330 formed on the light-reflection-side coating film 300a (300), the thicknesses of the $SiO_2$ film/$TiO_2$ film were 75 nm/48 nm in conformity with the lasing wavelength.

In other respects, the structure of the nitride semiconductor laser chip according to Practical Example 1-2 was similar to that in Practical Example 1-1.

With the nitride semiconductor laser chip according to Practical Example 1-2 structured as described above, the Ar content in the high-reflectance multi-layer film 230 was measured by AES. The results were as follows: in both the $SiO_2$ film and the SiN film, the Ar content was 3% by number of atoms.

Also in Practical Example 1-2, as in Practical Example 1-1, superb high-output characteristics were obtained.

PRACTICAL EXAMPLE 1-3

Figure 10:
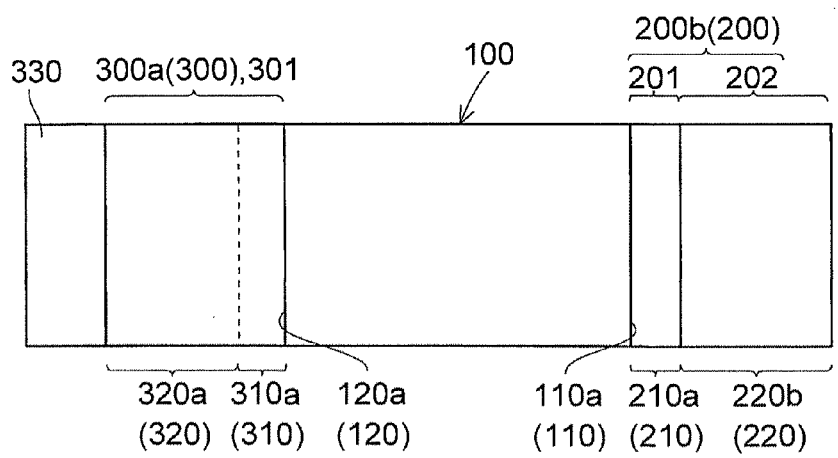
FIG. 10 is a side view schematically showing a nitride semiconductor laser chip according to Practical Example 1-3 of the invention.

FIG. 10 is a side view schematically showing a nitride semiconductor laser chip according to Practical Example 1-3. Next, with reference to FIG. 10, the nitride semiconductor laser chip according to Practical Example 1-3 will be described.

In the nitride semiconductor laser chip according to Practical Example 1-3, the structure of the light-emission-side coating film 200 differed from that in Practical Example 1-1. Specifically, in Practical Example 1-3, the coating film 200 (200b) was given a two-layer structure in which a low-Ar region 210a (210) formed of an $Al_2O_3$ film 201 and a high-Ar region 220b (220) formed of a $SiO_2$ film 202 were stacked. That is, in Practical Example 1-3, the low-Ar region 210a and the high-Ar region 220b were formed of different materials.

The thickness of the low-Ar region 210a was 20 nm as in Practical Example 1-1, and also the thickness of the high-Ar region 220b was 220 nm as in Practical Example 1-1. The low-Ar region 210a was formed by an ECR sputtering process under the same conditions as in Practical Example 1-1.

The high-Ar region 220b formed of the $SiO_2$ film 202 was formed by an ECR sputtering process with Si as a target. The high-Ar region 220b was formed under the following conditions: Ar gas flow amount, 20.0 sccm; $O_2$ gas flow amount, 6.5 sccm; microwave power, 500 W; and RF power, 500 W. At this time, the film formation rate was 2.6 Å/sec. The film formation temperature of the $SiO_2$ film 202 was the same as that of the $Al_2O_3$ film 201, specifically about 200° C.

In other respects, the structure of the nitride semiconductor laser chip according to Practical Example 1-3 was similar to that in Practical Example 1-1.

In the nitride semiconductor laser chip according to Practical Example 1-3, forming the light-emission-side low-Ar region 210a and high-Ar region 220b out of mutually different materials as described above helps increase flexibility in the design of the coating film 200 (200b), and thus it is possible to suppress deterioration of the light-emission-side resonator facet 110a (110) more easily. It is thereby possible to easily obtain sufficient reliability even at high output. Incidentally, forming the low-Ar region 210a and the high-Ar region 220b out of mutually different materials also brings about an effect of making it easy to design the reflectance of the coating film 200 (200b).

With the nitride semiconductor laser chip according to Practical Example 1-3 structured as described above, the Ar content in the coating film 200 (200b) was measured by AES. The results were as follows: the Ar content in the high-Ar region 220b was 3% by number of atoms, and thus was higher than that in the low-Ar region 210a, namely 2% by number of atoms.

Also in Practical Example 1-3, as in Practical Example 1-1, superb high-output characteristics were obtained.

PRACTICAL EXAMPLE 1-4

Figure 11:
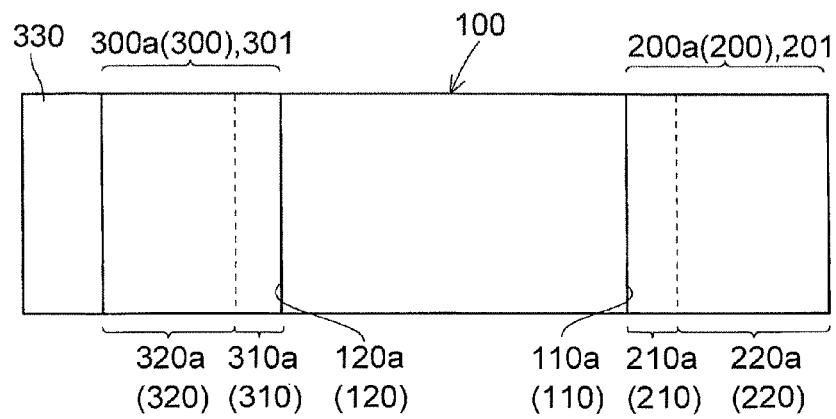
FIG. 11 is a side view schematically showing a nitride semiconductor laser chip according to Practical Example 1-4 of the invention.

FIG. 11 is a side view schematically showing a nitride semiconductor laser chip according to Practical Example 1-4.

Next, with reference to FIG. 11, the nitride semiconductor laser chip according to Practical Example 1-4 will be described.

In the nitride semiconductor laser chip according to Practical Example 1-4, the structure of the light-reflection-side high-reflectance multi-layer film 330 differed from that in Practical Example 1-1. Specifically, whereas in Practical Example 1-1 the $SiO_2$ film/$TiO_2$ film as the light-reflection-side high-reflectance multi-layer film 330 were formed by an EB vapor deposition process, in Practical Example 1-4 they are formed by an ECR sputtering process.

In other respects, the structure of the nitride semiconductor laser chip according to Practical Example 1-4 is similar to that in Practical Example 1-1.

With the nitride semiconductor laser chip according to Practical Example 1-4 structured as described above, the Ar content in the high-reflectance multi-layer film 330 was measured by AES. The results were as follows: the Ar content in the $SiO_2$ film was 5% by number of atoms, and the Ar content in the $TiO_2$ film was 3% by number of atoms.

When the nitride semiconductor laser chips according to Practical Examples 1-4 were mounted, a construction was adopted that allowed the slight amount of light emitted through the light-reflection-side resonator facet 120a (120) to be monitored with a photodiode (PD). It was thereby confirmed that there were less variations in the value of the current through the PD being operated.

Also in Practical Example 1-4, as in Practical Example 1-1, superb high-output characteristics were obtained.

Embodiment 2

Next, a nitride semiconductor laser chip according to a second embodiment (Embodiment 2) of the invention will be described.

A nitride semiconductor laser chip according to Embodiment 2 differs in structure from one according to Embodiment 1 in that the low-Ar region is crystallized. Absorption of Ar into a crystallized coating film causes destruction of the crystalline state, and thus causes light absorption. This makes it necessary to reduce the amount of Ar absorbed.

The low-Ar region can be turned into a crystalline state, for example, by changing the film formation conditions, such as film formation temperature and film formation rate, from those for making it into an amorphous state, or by using a material that crystallizes easily. In general, it is easier to crystallize a coating film when it is formed at high temperature and low film formation rate. Examples of materials that crystallize easily include aluminum nitride (AlN), aluminum oxynitride (AlON), zirconium oxide ($ZrO_2$), titanium oxide ($TiO_2$), and zinc oxide (ZnO).

On the other hand, examples of materials that turn into an amorphous state easily include oxides of aluminum (Al), silicon (Si), zirconium (Zr), tantalum (Ta), gallium (Ga), yttrium (Y), niobium (Nb), hafnium (Hf), and titanium (Ti), nitrides and oxynitrides of Si, etc. Depending on the film formation conditions, even these materials can turn into a crystalline state.

It is also possible to form a film in an amorphous state first and then heat it to crystallize it. The heating here may be achieved by, for example, an annealing process at a temperature of 400° C. or more, or a laser annealing process using an excimer laser or a YAG (yttrium aluminum garnet) laser. In that case, it is preferable that the heating be performed after formation of the low-Ar region, before formation of high-Ar region.

Here, a crystalline state (crystallized state) encompasses a monocrystalline state, a polycrystalline state, a mixed state of these, and a partly amorphous state.

In other respects, the structure in Embodiment 2 is similar to that in Embodiment 1.

In Embodiment 2, by crystallizing the low-Ar region in a coating film as described above, it is possible to enhance the adhesion between the coating film and the resonator facet. The enhanced adhesion helps improve the reliability of the nitride semiconductor laser chip. Thus, it is possible to easily obtain a nitride semiconductor laser chip with superb high-output characteristics. Incidentally, by making the crystal type of the crystallized low-Ar region uniform, it is possible to further enhance adhesion. Moreover, by crystallizing the low-Ar region in a coating film, since a crystalline film is less permeable to moisture and oxygen from the atmosphere than an amorphous film, it is possible to effectively suppress moisture and oxygen penetrating to the resonator facet. Furthermore, growing the low-Ar region epitaxially with respect to the base semiconductor (resonator facet) gives better crystallinity, and thus helps further enhance the permeation suppressing effect.

In Embodiment 2, crystallizing the resonator-facet-side region of a coating film makes it possible to form the low-Ar region with a low Ar content with satisfactory reproducibility.

In other respects, the effect of Embodiment 2 is similar to that of Embodiment 1.

The nitride semiconductor laser chip according to Embodiment 2 of the invention will now be described in more detail by way of practical examples.

EXAMPLE 2-1

Figure 12:
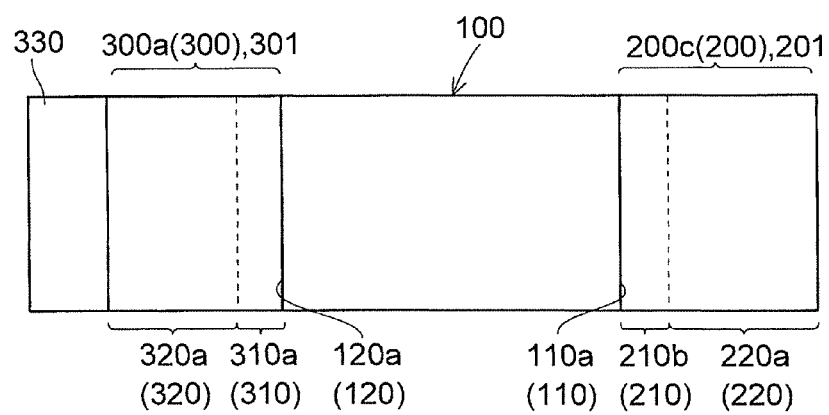
FIG. 12 is a side view schematically showing a nitride semiconductor laser chip according to Practical Example 2-1 of the invention.

FIG. 12 is a side view schematically showing a nitride semiconductor laser chip according to Practical Example 2-1. Next, with reference to FIG. 12, the nitride semiconductor laser chip according to Practical Example 2-1 will be described.

In the nitride semiconductor laser chip according to Practical Example 2-1, the structure of the light-emission-side coating film 200 differed from that in Practical Example 1-1. Specifically, in Practical Example 2-1, the low-Ar region 210b (210) was formed of a crystal of $Al_2O_3$. The crystalline $Al_2O_3$ here was formed by an ECR sputtering process under the following conditions: Ar gas flow amount, 10.0 sccm; $O_2$ gas flow amount, 8.0 sccm; microwave power, 500 W; and RF power, 500 W. At this time, the film formation rate was 0.22 Å/sec. The thickness of the low-Ar region 210b (210) was 20 nm as in Practical Example 1-1, and the film formation temperature of the low-Ar region 210b (210) was about 300° C.

The high-Ar region 220a (220) in the light-emission-side coating film 200c (200) was similar to that in Practical Example 1-1. However, the film formation temperature of the high-Ar region 220a (220) was the same (about 300° C.) as that of the low-Ar region 210b (210). Also, the light-reflection-side coating film 300a (300) was similar to that in Practical Example 1-1. In other respects, the structure of the nitride semiconductor laser chip according to Practical Example 2-1 was similar to that in Practical Example 1-1.

With the nitride semiconductor laser chip according to Practical Example 2-1 structured as described above, the Ar content in the low-Ar region 210b was measured by AES. The result was: 1% by number of atoms.

Moreover, through observation on a TEM (transmission electron microscope), it was confirmed that the $Al_2O_3$ in the low-Ar region 210b was in a crystalline state and that the $Al_2O_3$ in the low-Ar region 210b was in an amorphous state.

Through diffraction pattern analysis on the TEM, it was found that the crystalline state of $Al_2O_3$ in the low-Ar region 210b was a crystal system called $\gamma$-$Al_2O_3$, and thus a polycrystalline state.

Also in Practical Example 2-1, as in Practical Example 1-1, superb high-output characteristics were obtained.

EXAMPLE 2-2

Figure 13:
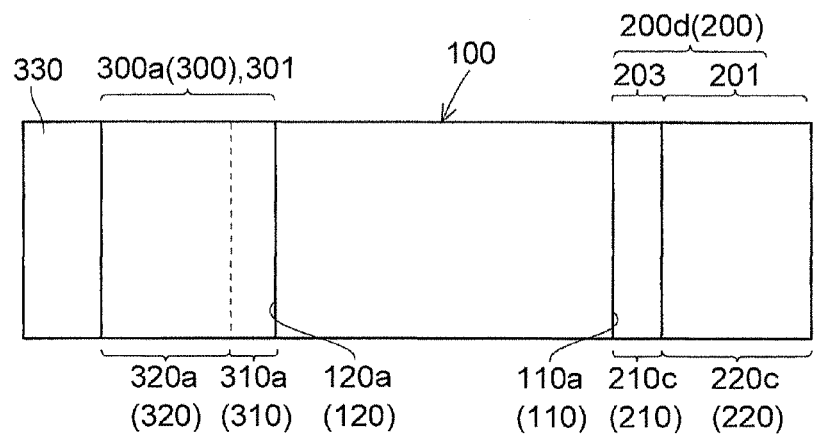
FIG. 13 is a side view schematically showing a nitride semiconductor laser chip according to Practical Example 2-2 of the invention.

FIG. 13 is a side view schematically showing a nitride semiconductor laser chip according to Practical Example 2-2. Next, with reference to FIGS. 5 and 13, the nitride semiconductor laser chip according to Practical Example 2-2 will be described.

In the nitride semiconductor laser chip according to Practical Example 2-2, the structure of the light-emission-side coating film 200 differed from that in Practical Example 1-1. Specifically, in Practical Example 2-2, the low-Ar region 210c was formed of a crystal of AlN (a crystallized MN film 203). The crystalline AlN here (AlN film 203) was formed by an ECR sputtering process under the following conditions: Ar gas flow amount, 20.0 sccm; $N_2$ gas flow amount, 6.5 sccm; microwave power, 700 W; and RF power, 700 W. At this time, the film formation rate was 1.1 Å/sec. The thickness of the low-Ar region 210c was 20 nm as in Practical Example 1-1.

The high-Ar region 220c (220) in the light-emission-side coating film 200d (200) was formed of an $Al_2O_3$ film 201 formed under the same conditions as the high-Ar region 220a (see FIG. 5) in Practical Example 1-1. The thickness of the high-Ar region 220c was, unlike that in Practical Example 1-1, 230 nm. The light-reflection-side coating film 300a (300) was similar to that in Practical Example 1-1. In Practical Example 2-2, the coating film 200d (200) was formed without heating (with the heating function turned off).

In other respects, the structure of the nitride semiconductor laser chip according to Practical Example 2-2 was similar to that in Practical Example 1-1.

Figure 14:
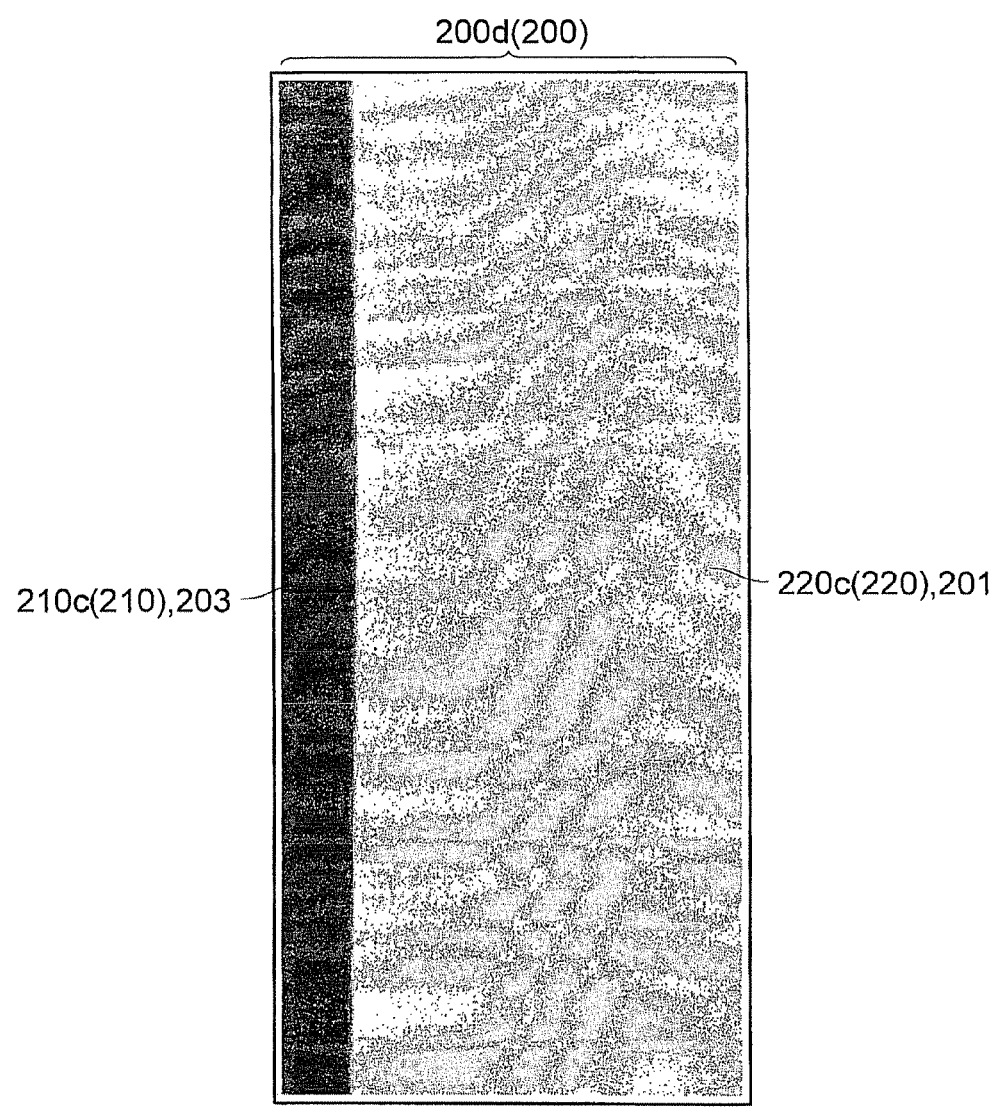
FIG. 14 is a microscope image of a light-emission-side coating film in a nitride semiconductor laser chip according to Practical Example 2-2, as observed on a TEM.
Figure 15:
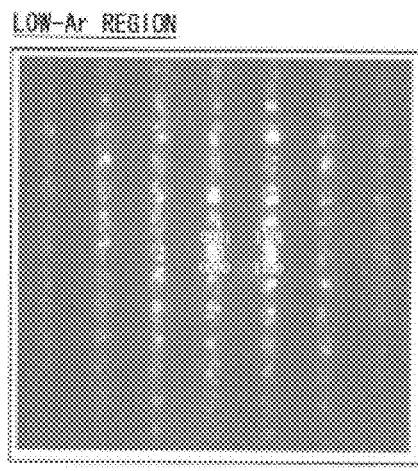
FIG. 15 is a diagram showing the diffraction pattern of a light-emission-side coating film in a nitride semiconductor laser chip according to Practical Example 2-2.
Figure 16:
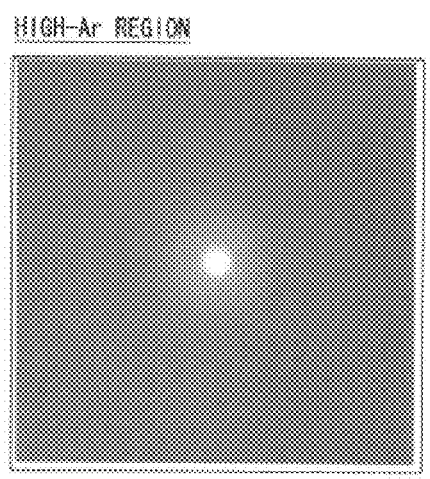
FIG. 16 is a diagram showing the diffraction pattern of a light-emission-side coating film in a nitride semiconductor laser chip according to Practical Example 2-2.

FIG. 14 is a microscope image, observed on a TEM, of the light-emission-side coating film in the nitride semiconductor laser chip according to Practical Example 2-2. FIGS. 15 and 16 are diagrams showing the diffraction pattern of the light-emission-side coating film in the nitride semiconductor laser chip according to Practical Example 2-2. FIG. 15 shows the diffraction pattern of the low-Ar region 210c (see FIG. 14), and FIG. 16 shows the diffraction pattern of the high-Ar region 220c (see FIG. 14).

As FIGS. 15 and 16 show, whereas in the diffraction pattern of the low-Ar region 210c diffraction spots indicating a crystalline state were observed, in the diffraction pattern of the high-Ar region 220c no such diffraction spots were observed, indicating that the high-Ar region 220c was in an amorphous state.

A detailed analysis of the pattern of diffraction spots of the low-Ar region 210c revealed the following. The Ar region 210c had a crystalline state that was substantially monocrystalline, and had a crystal system that was hexagonal, the same crystal system as the nitride semiconductor layers. Furthermore, the low-Ar region 210c exhibited growth closely resembling epitaxial growth, as a result of having taken over the crystalline state of the nitride semiconductor layers forming the resonator facet 110a (110), and its stacking direction (crystal orientation) was <1-100>.

The Ar content in the coating film 200d (200) was measured by AES. The results were as follows: in the low-Ar region 210c, the Ar content was 1% by number of atoms, which was an extremely low value close to the detection limit of the testing equipment; on the other hand, the Ar content in the high-Ar region 220c was about 4% by number of atoms.

In addition to the AES measurement mentioned above, also by EDX, the Ar content in the coating film was measured.

Figure 17:
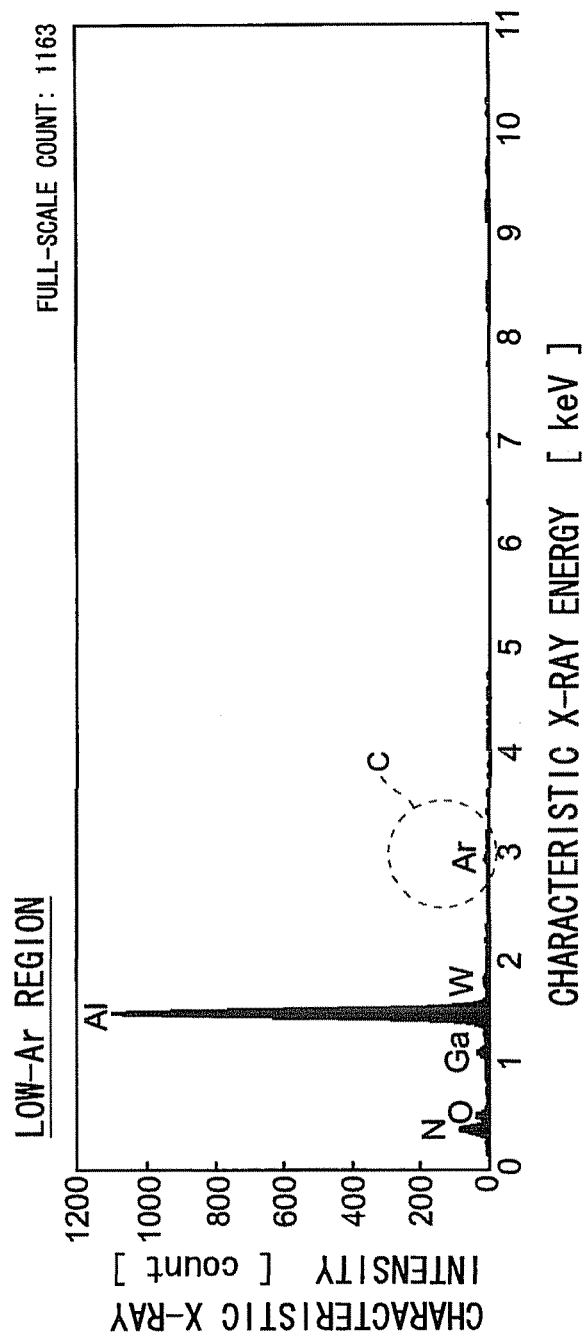
FIG. 17 is a graph showing the results of EDX measurement on a light-emission-side coating film in a nitride semiconductor laser chip according to Practical Example 2-2.
Figure 18:
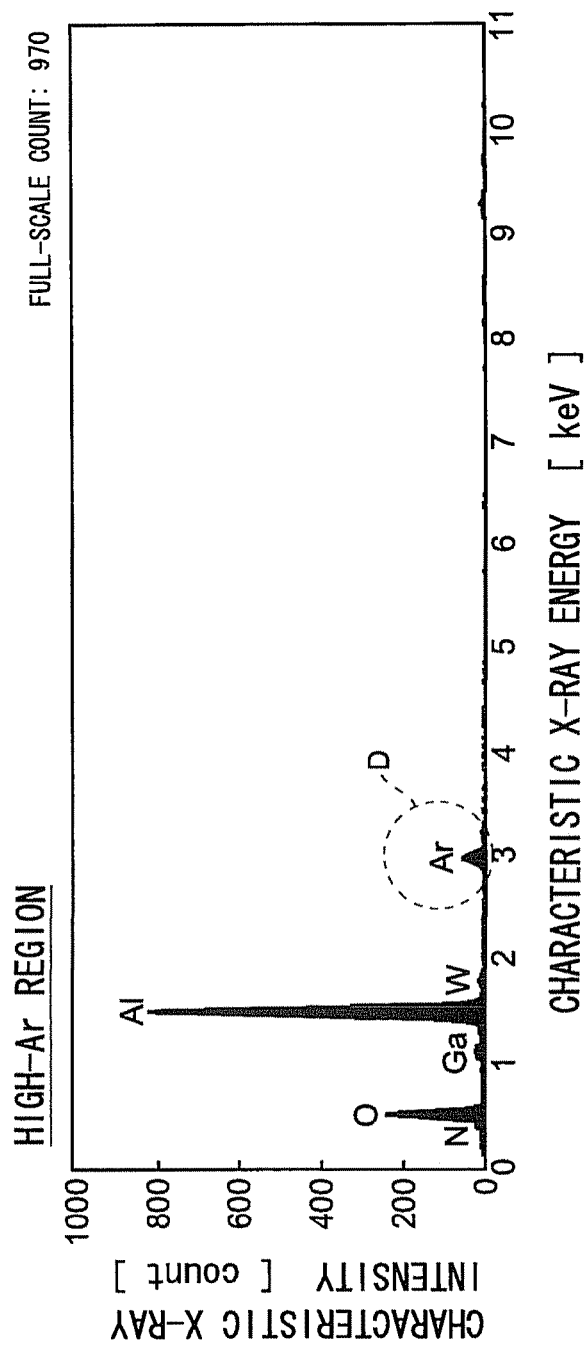
FIG. 18 is a graph showing the results of EDX measurement on a light-emission-side coating film in a nitride semiconductor laser chip according to Practical Example 2-2.

FIGS. 17 and 18 are graphs showing the result of EDX measurement on the light-emission-side coating film in the nitride semiconductor laser chip according to Practical Example 2-2. FIG. 17 shows the results of EDX measurement on the low-Ar region 210c (see FIG. 13), and FIG. 18 shows the results of EDX measurement on the high-Ar region 220c (see FIG. 13).

Comparing the Ar signal intensity enclosed in the broken-line circle C in FIG. 17 with the Ar signal intensity enclosed in the broken-line circle D in FIG. 18 reveals that the Ar signal intensity in the low-Ar region shown in FIG. 17 was lower than the Ar signal intensity in the high-Ar region shown in FIG. 18. Thus, EDX measurement too revealed that the Ar content in the low-Ar region was lower than the Ar content in the high-Ar region. Moreover, as FIG. 17 shows, the Ar signal intensity in the low-Ar region was extremely low, and this too indicates that the crystallized low-Ar region 210c contained almost no Ar.

Also in Practical Example 2-2, as in Practical Example 1-1, superb high-output characteristics were obtained.

Subsequently, a plurality of samples of nitride semiconductor laser chips like that of Practical Example 2-2 were fabricated, and were subjected to aging tests. In the aging tests, three nitride semiconductor laser chips were used, and they were made to lase continuously to emit laser light at an optical output of 500 mW in a temperature environment of 80° C.

Figure 19:
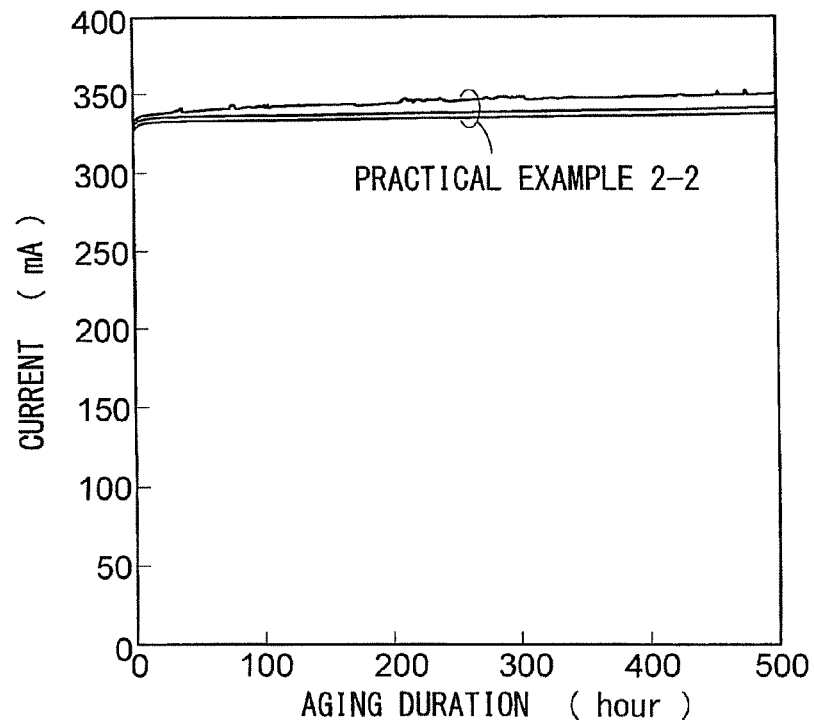
FIG. 19 is a graph showing the results of aging tests with a nitride semiconductor laser chip according to Practical Example 2-2.

FIG. 19 is a graph showing the results of aging tests with (samples of) the nitride semiconductor laser chip according to Practical Example 2-2. In FIG. 19, the value of the current (mA) fed to the nitride semiconductor laser chip is taken on the vertical axis, and the duration of aging (hours) is taken on the horizontal line.

FIG. 19 reveals the following. All the three samples of the nitride semiconductor laser chip according to Practical Example 2-2 which were subjected to aging tests operated stably up to 500 hours without ceasing to lase.

EXAMPLE 2-3

Figure 20:
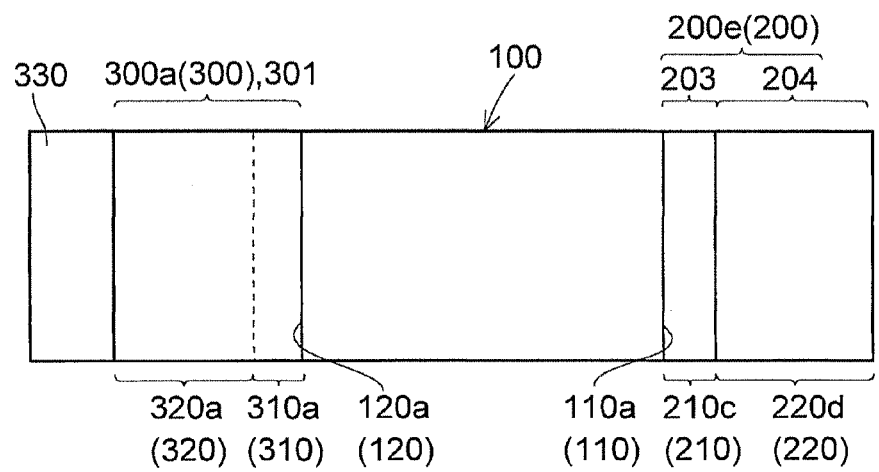
FIG. 20 is a side view schematically showing a nitride semiconductor laser chip according to Practical Example 2-3.

FIG. 20 is a side view schematically showing a nitride semiconductor laser chip according to Practical Example 2-3. Next, with reference to FIG. 20, the nitride semiconductor laser chip according to Practical Example 2-3 will be described.

In the nitride semiconductor laser chip according to Practical Example 2-3, in the above-described structure of Practical Example 2-2, the high-Ar region 220 in the light-emission-side coating film 200 is formed of, instead of the $Al_2O_3$ film 201 (see FIG. 13), a SiN film 204. Specifically, in Practical Example 2-3, on the light-emission-side resonator facet 110a (110), a coating film 200e (200) including a high-Ar region 220d (220) formed of a SiN film 204 is formed. The SiN film 204 (high-Ar region 220d) was formed under the following conditions: Ar gas flow amount, 40.0 sccm; $N_2$ gas flow amount, 5.0 sccm; microwave power, 500 W; and RF power, 500 W. At this time, the film formation rate was 1.5 Å/sec. The thickness of the high-Ar region 220d was 230 nm as in Practical Example 2-2. In Practical Example 2-3, as in Practical Example 2-2, the coating film 200e (200) was formed without heating (with the heating function turned off).

In other respects, the structure of the nitride semiconductor laser chip according to Practical Example 2-3 was similar to that in Practical Example 2-2.

Figure 21:
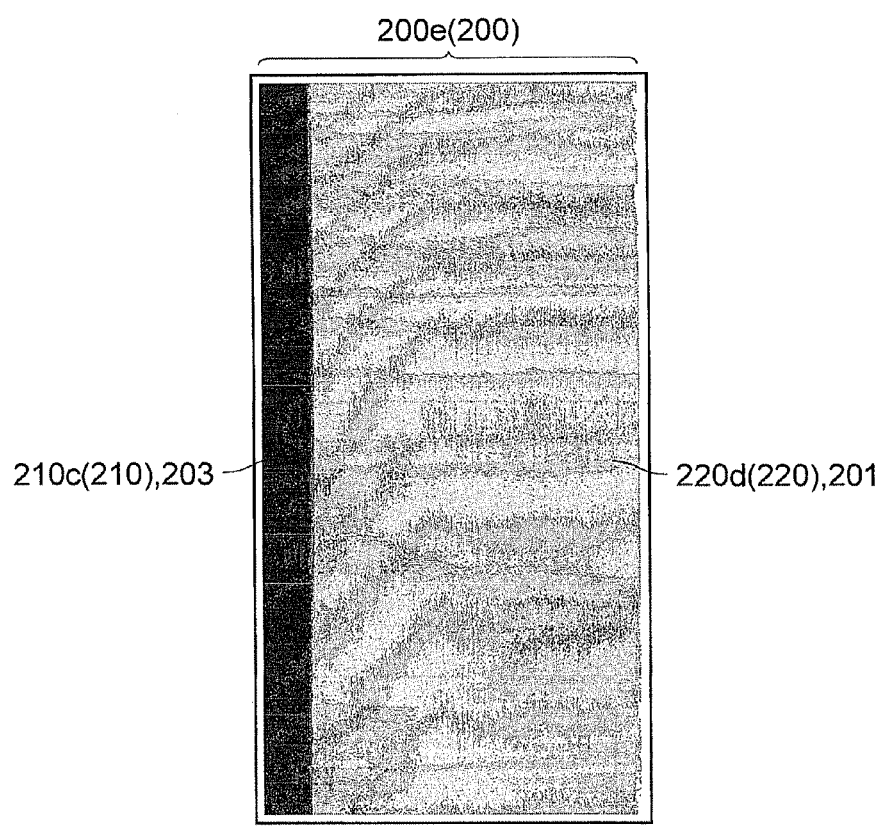
FIG. 21 is a microscope image of a light-emission-side coating film in a nitride semiconductor laser chip according to Practical Example 2-3, as observed on a TEM.
Figure 22:
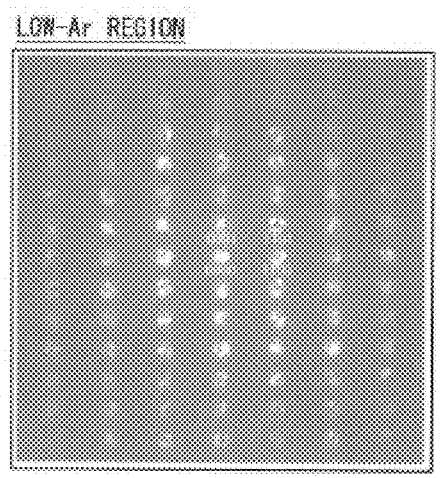
FIG. 22 is a diagram showing the diffraction pattern of a light-emission-side coating film in a nitride semiconductor laser chip according to Practical Example 2-3.
Figure 23:
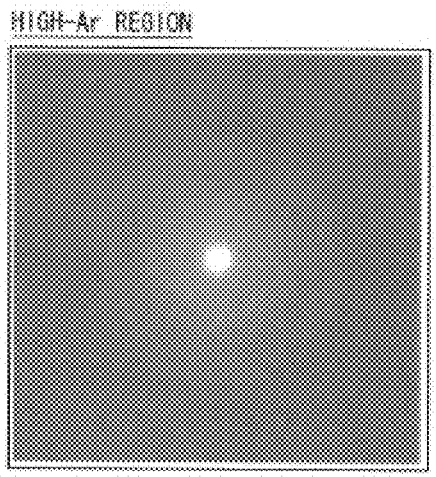
FIG. 23 is a diagram showing the diffraction pattern of a light-emission-side coating film in a nitride semiconductor laser chip according to Practical Example 2-3.

FIG. 21 is a microscope image, observed on a TEM, of the light-emission-side coating film in the nitride semiconductor laser chip according to Practical Example 2-3. FIGS. 22 and 23 are diagrams showing the diffraction pattern of the light-emission-side coating film in the nitride semiconductor laser chip according to Practical Example 2-3. FIG. 22 shows the diffraction pattern of the low-Ar region 210c (see FIG. 21), and FIG. 23 shows the diffraction pattern of the high-Ar region 220d (see FIG. 21).

As FIG. 22 shows, an analysis of the diffraction pattern of the low-Ar region 210c (see FIG. 21) revealed that the low-Ar region 210c was in a crystalline state as in Practical Example 2-2. A more detailed analysis of the diffraction pattern revealed the following. The low-Ar region 210c had a crystalline state that was substantially monocrystalline, and had a crystal system that was hexagonal, the same crystal system as the nitride semiconductor layers. Furthermore, the low-Ar region 210c exhibited growth closely resembling epitaxial growth, as a result of having taken over the crystalline state of the nitride semiconductor layers forming the resonator facet 110a (110) (see FIG. 20), and its stacking direction (crystal orientation) was <1-100>.

As FIG. 23 shows, judging from its diffraction pattern, the high-Ar region 220d (see FIG. 21) was in a state generally amorphous but containing microcrystals.

Figure 24:
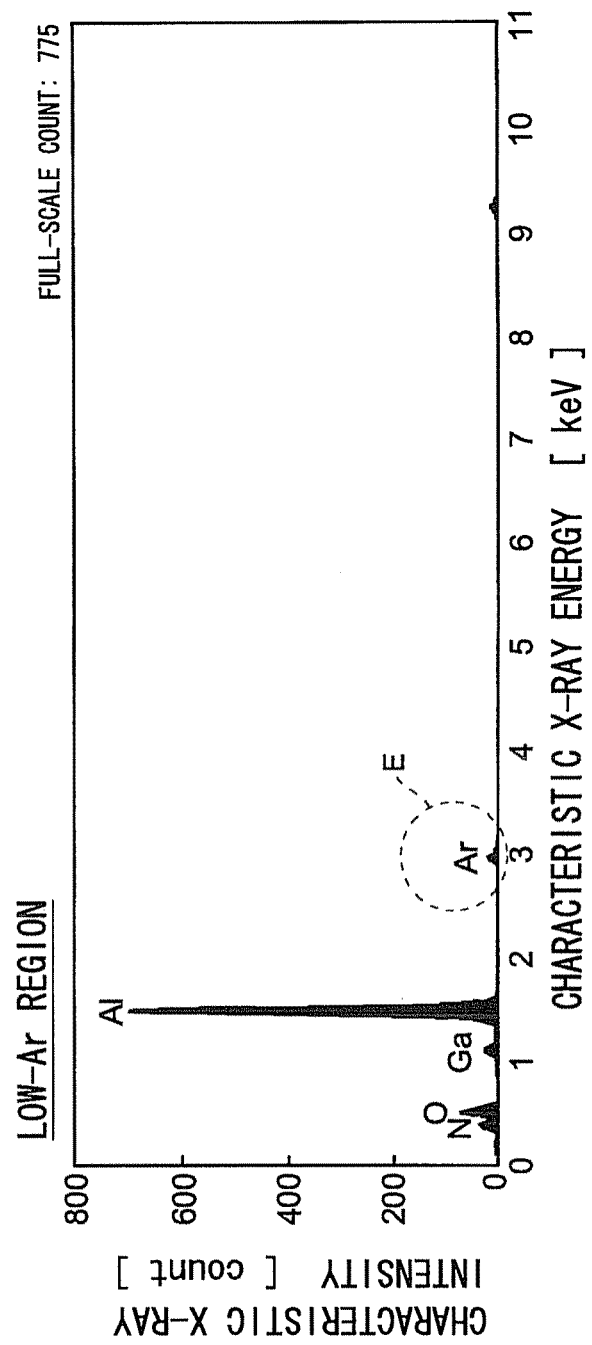
FIG. 24 is a graph showing the results of EDX measurement on a light-emission-side coating film in a nitride semiconductor laser chip according to Practical Example 2-3.
Figure 25:
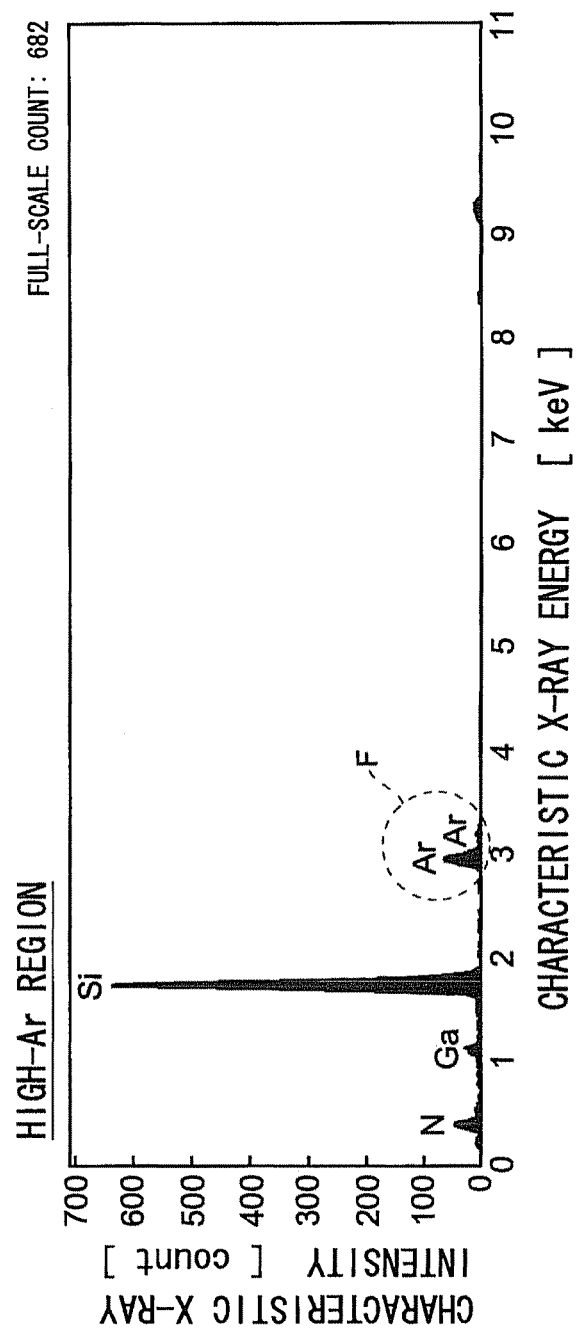
FIG. 25 is a graph showing the results of EDX measurement on a light-emission-side coating film in a nitride semiconductor laser chip according to Practical Example 2-3.

FIGS. 24 and 25 are graphs showing the result of EDX measurement on the light-emission-side coating film in the nitride semiconductor laser chip according to Practical Example 2-3. FIG. 24 shows the results of EDX measurement on the low-Ar region 210c (see FIG. 20), and FIG. 25 shows the results of EDX measurement on the high-Ar region 220d (see FIG. 20).

Comparing the Ar signal intensity enclosed in the broken-line circle E in FIG. 24 with the Ar signal intensity enclosed in the broken-line circle F in FIG. 25 reveals that the Ar signal intensity in the low-Ar region shown in FIG. 24 was lower than the Ar signal intensity in the high-Ar region shown in FIG. 25. Thus, through EDX measurement, it was confirmed that the Ar content in the low-Ar region 210c was lower than the Ar content in the high-Ar region 220d.

Also in Practical Example 2-3, as in Practical Example 1-1, superb high-output characteristics were obtained.

EXAMPLE 2-4

Figure 26:
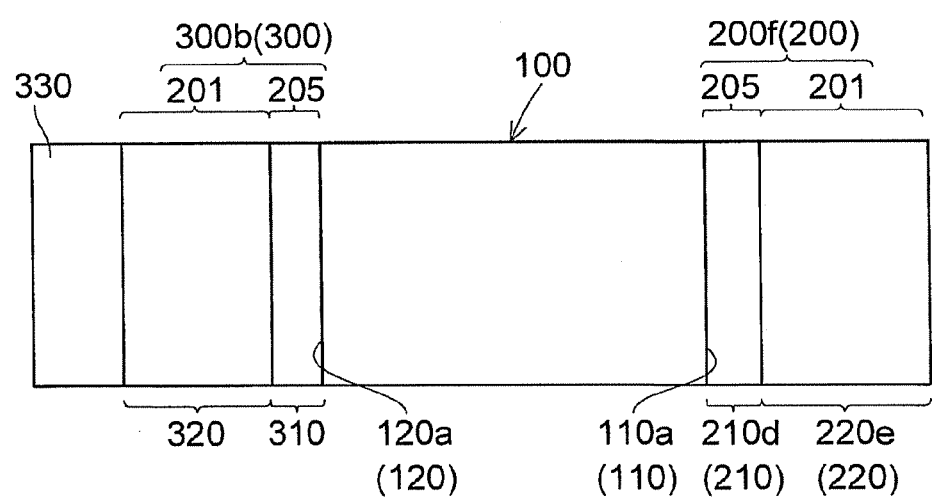
FIG. 26 is a side view schematically showing a nitride semiconductor laser chip according to Practical Example 2-4.

FIG. 26 is a side view schematically showing a nitride semiconductor laser chip according to Practical Example 2-4. Next, with reference to FIG. 26, the nitride semiconductor laser chip according to Practical Example 2-4 will be described.

The nitride semiconductor laser chip according to Practical Example 2-4 was a modified version of that of Practical Example 2-2, and the low-Ar region 210d (210) here was formed of a crystal of AlON (a crystallized AlON film 205). The crystalline AlON here (the AlON film 205) was formed by an ECR sputtering process under the following conditions: Ar gas flow amount, 20.0 sccm; $O_2$ gas flow amount, 0.2 sccm; $N_2$ gas flow amount, 5.5 sccm; microwave power, 500 W; and RF power, 500 W. At this time, the film formation rate was 1.3 Å/sec. The thickness of the low-Ar region 210d was 35 nm. The high-Ar region 220e (220) was formed of an $Al_2O_3$ film 201 formed under the same conditions as in Practical Example 2-2, and its thickness was 223 nm.

As described above, in Practical Example 2-4, on the light-emission-side resonator facet 110a (110), a coating film 200f (200) having a two-layer structure in which a AlON film 205 and an $Al_2O_3$ film 201 were stacked was formed. With this structure, the reflectance on the light emission side was 11%.

Moreover, in Practical Example 2-4, also on the light reflection side, a coating film 300b (300) similar to the light-emission-side coating film 200f was formed. Furthermore, on the light-reflection-side coating film 300b, a high-reflectance multi-layer film 330 similar to that in Practical Example 1-1 was formed. Also in Practical Example 2-4, the coating film 200f (200) was formed without heating (with the heating function turned off). Like the light-emission-side coating film 200f, the light-reflection-side coating film 300b (300) too was formed without heating (with the heating function turned off).

The Ar content in the light-emission-side coating film was measured by AES. The results were as follows: as in Practical Example 2-2, in the low-Ar region 210d, 1% by number of atoms; and in high-Ar region 220e, about 4% by number of atoms.

In other respects, the structure of the nitride semiconductor laser chip according to Practical Example 2-4 was similar to that in Practical Example 2-2. Also in Practical Example 2-4, as in Practical Example 1-1, superb high-output characteristics were obtained.

EXAMPLE 2-5

Figure 27:
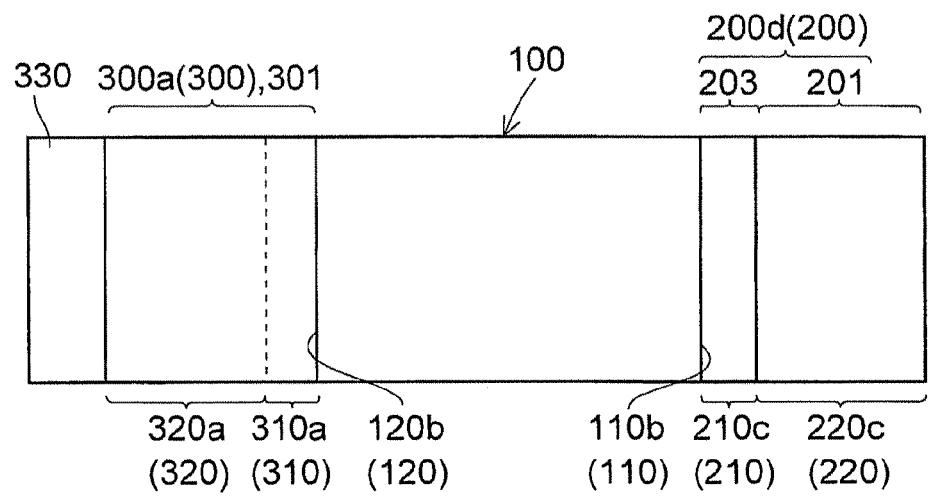
FIG. 27 is a side view schematically showing a nitride semiconductor laser chip according to Practical Example 2-5.

FIG. 27 is a side view schematically showing a nitride semiconductor laser chip according to Practical Example 2-5. Next, with reference to FIGS. 2, 3, and 27, the nitride semiconductor laser chip according to Practical Example 2-5 will be described.

The nitride semiconductor laser chip according to Practical Example 2-5 was a modified version of that of Practical Example 2-2, and it used, as the substrate 10 (see FIGS. 2 and 3), an n-type GaN substrate of which the crystal orientation of the principal growth plane (the plane on which the nitride semiconductor layers were grown) was a {1-100} plane and which had an off angle of about 3 degrees in a <11-20> direction.

The crystal orientation of the resonator facets was a {0001} plane. Specifically, the crystal orientation of the light-emission-side resonator facet 110b (110) was a (0001) plane, and the crystal orientation of the light-reflection-side resonator facet 120b (120) was a (000-1) plane. Thus, the ridge portion 55 (see FIGS. 2 and 3) was formed to extend in the direction parallel to a <0001> direction.

The light-emission-side coating film 200 and the light-reflection-side coating film 300 were similar to those in Practical Example 2-2.

As with Practical Example 2-2, also here, through TEM observation and through diffraction pattern analysis, the crystalline state of the AlN in the low-Ar region 210c was inspected. The results were as follows. As in Practical Example 2-2, the AlN in the low-Ar region 210c had a crystalline state that was substantially monocrystalline, and had a crystal system that was hexagonal. The low-Ar region 210c exhibited growth closely resembling epitaxial growth, as a result of having taken over the crystalline state of the nitride semiconductor layers forming the resonator facet 110b, and its crystal orientation (stacking direction) was <1-100>. In other respects, the structure here was similar to that in Practical Example 2-2.

It has conventionally been found out that, when a light-emitting diode chip is formed by stacking nitride semiconductor layers on top of a nitride semiconductor substrate having as the principal growth plane a {1-100} plane having no off angle, and then an electric current is injected into the light-emitting diode chip to make it produce electroluminescence (EL), a bright-spotted light emission pattern results. A bright-spotted light emission pattern is undesirable, because it causes a lowering in gain in the formation of the nitride semiconductor laser chip.

It has also conventionally been found out, however, that using a substrate having an off angle in a <11-20> direction as in Practical Example 2-5 improves the light emission pattern, offering uniform light emission across the plane. From the perspective of obtaining good surface morphology, it is preferable that the off angle in a <11-20> direction be 0.1 degrees or more, and more preferably 1 degree or more. An off angle more than 10 degrees, however, tends to cause poor surface morphology. Accordingly, it is preferable that the off angle in a <11-20> direction be 0.1 degrees or more but 10 degrees or less, and more preferably 1 degree or more but 10 degrees or less. An off angle in a <11-20> direction within the just-mentioned range gives good surface morphology.

Poor surface morphology may lead to poor flatness on a resonator facet. Moreover, since the light-emission-side resonator facet 110b is a (0001) plane as described above, the resonator facet is not a cleavage surface, and this makes it difficult to form a satisfactorily vertical facet when the resonator facet is formed by cleaving.

Using, however, a substrate having as the principal growth plane a {1-100} plane and having an off angle of 0.1 degrees or more but 10 degrees or less in a <11-20> direction makes it is possible to improve surface morphology and improve flatness on the cleavage surface. It has then be found out that, also by forming a coating film according to the invention on a resonator facet that is not a cleavage plane, it is possible to form a highly reliable coating film.

Also in Practical Example 2-5, as in Practical Example 1-1, superb high-output characteristics were obtained.

It should be understood that the embodiments disclosed herein are in every respect illustrative and not restrictive. The scope of the present invention is set out not in the description of the embodiments presented above but in the appended claims, and encompasses any variations and modifications within the sense and scope equivalent to those of the claims.

For example, although Embodiments 1 and 2 described above deal with examples where a coating film including a low-Ar region and a high-Ar region is formed also on a light-reflection-side resonator facet, this is not meant to limit the invention; it is also possible to adopt a structure in which no coating film is formed on the light-reflection-side resonator facet.

Although Embodiments 1 and 2 described above deal with examples where, when a coating film is formed by a sputtering method, Ar is used as the gas source (sputtering gas) of incident ions, this is not meant to limit the invention; it is also possible to use, as the gas source, any rare gas (rare gas element) other than Ar. For example, it is possible to use, as the gas source of incident ions, any rare gas (rare gas element) other than Ar, such as He (helium), Ne (neon), or Xe (xenon). In that case, rare gas atoms other than Ar are contained in the coating film, but even with such a design an effect similar to that of the invention is obtained. A mixed gas of those (a mixed gas of two or more rare gasses) may be used as the sputtering gas. For example, it is possible to use a mixed gas of Ar and Ne as the sputtering gas.

Although the description of Embodiments 1 and 2 described above assumes that a high-reflectance multi-layer film is not included in a coating film, in a case where a high-reflectance multi-layer film is formed, it may be included in a coating film. In that case, if the high-reflectance multi-layer film includes a region with a higher Ar content than a low-Ar region, that region may be used as a high-Ar region. The Ar content in a high-Ar region does not necessarily have to be constant in the thickness direction; a high-Ar region has only to include, at least as part of it, a region with a higher Ar content than a low-Ar region.

In Embodiments 1 and 2 described above, the Ar content in a low-Ar region may be 3% or more by number of atoms (for example, about 3% to 5% by number of atoms).

In Embodiments 1 and 2 described above, between a low-Ar region and a high-Ar region, a region other than a low-Ar region and a high-Ar region may be interposed. For example, between a low-Ar region and a high-Ar region, another film may be interposed. In that case, the Ar content in this film (region) may be lower, or higher, than in the low-Ar region. Another film (region) may be provided outward of a high-Ar region (on the side opposite from a low-Ar region). Such an extra film (region) may be formed by a sputtering process, or may be formed by a process other than a sputtering process, such as a vapor deposition process.

In Embodiments 1 and 2 described above, a coating film may be given a multi-layer structure composed of three or more layers.

Nitride semiconductor laser chips according to Embodiments 1 and 2 described above may be implemented in any other manners than specifically described above by way of practical examples (Practical Examples 1-1 to 1-4 and Practical Examples 2-1 to 2-5), which are thus not meant to impose any limitation whatsoever.

What is claimed is:

1. A nitride semiconductor laser chip comprising:
   a nitride semiconductor layer formed on a substrate;
   a resonator facet formed on the nitride semiconductor layer; and
   a coating film formed on the resonator facet and containing a rare gas element,
   the coating film including a first region and a second region,
   the first region being in contact with the resonator facet and disposed between the resonator facet and the second region, and
   a percentage by number of atoms of the rare gas element in the first region being lower than a percentage by number of atoms of the rare gas element in the second region.

2. The nitride semiconductor laser chip according to claim 1, wherein the first and second regions are formed of mutually different materials.

3. The nitride semiconductor laser chip according to claim 1, wherein the first and second regions are formed of a same material.

4. The nitride semiconductor laser chip according to claim 1, wherein the first region of the coating film includes an aluminum nitride film or an aluminum oxynitride film.

5. The nitride semiconductor laser chip according to claim 1, wherein the first region of the coating film includes an aluminum oxide film.

6. The nitride semiconductor laser chip according to claim 1, wherein the second region of the coating film includes an aluminum oxide film, a silicon oxide film, or a silicon nitride film.

7. The nitride semiconductor laser chip according to claim 1, wherein the first region has a thickness of 5 nm or more but 100 nm or less in a thickness direction of the coating film.

8. The nitride semiconductor laser chip according to claim 1, wherein the second region has a greater thickness than the first region in a thickness direction of the coating film.

9. The nitride semiconductor laser chip according to claim 1, wherein the rare gas element is argon, and a percentage by number of atoms of Ar in the first region is 3% or less by number of atoms.

10. The nitride semiconductor laser chip according to claim 9, wherein the percentage by number of atoms of Ar in the first region is 1% or less by number of atoms.

11. The nitride semiconductor laser chip according to claim 1, wherein the resonator facet comprises a light-emission-side resonator facet and a light-reflection-side resonator facet, and the coating film comprises a coating film formed on the light-emission-side resonator facet and a coating film formed on the light-reflection-side resonator facet.

12. The nitride semiconductor laser chip according to claim 1, wherein the first region in the coating film is crystallized.

13. The nitride semiconductor laser chip according to claim 1, wherein the second region in the coating film includes at least a region in an amorphous state.

14. The nitride semiconductor laser chip according to claim 1, wherein the percentage by number of atoms of the rare gas element in the first region is less than 3% by number of atoms.

* * * * *